(12) United States Patent
Do

(10) Patent No.: US 12,477,867 B2
(45) Date of Patent: Nov. 18, 2025

(54) ULTRA-THIN LED ELECTRODE ASSEMBLY AND METHOD FOR MANUFACTURING THEREOF

(71) Applicant: KOOKMIN UNIVERSITY INDUSTRY ACADEMY COOPERATION FOUNDATION, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

(*) Notice: Subject to any disclaimer, the term of this patent is extended or adjusted under 35 U.S.C. 154(b) by 770 days.

(21) Appl. No.: 17/564,488

(22) Filed: Dec. 29, 2021

(65) Prior Publication Data
US 2022/0310878 A1    Sep. 29, 2022

(30) Foreign Application Priority Data

Mar. 25, 2021 (KR) .................. 10-2021-0039000

(51) Int. Cl.
| | |
|---|---|
| *H10H 20/831* | (2025.01) |
| *H10H 20/01* | (2025.01) |
| *H10H 20/825* | (2025.01) |
| *H10H 20/832* | (2025.01) |

(52) U.S. Cl.
CPC ........ *H10H 20/8312* (2025.01); *H10H 20/01* (2025.01); *H10H 20/825* (2025.01); *H10H 20/832* (2025.01); *H10H 20/032* (2025.01)

(58) Field of Classification Search
CPC .. H10H 20/8312; H10H 20/01; H10H 20/825; H10H 20/832; H10H 20/032; H10H 20/018; H10H 20/817; H10H 20/819; H10H 20/0137; H10H 20/83; H10H 20/84; H10H 20/857
See application file for complete search history.

(56) References Cited

U.S. PATENT DOCUMENTS

| | | | |
|---|---|---|---|
| 9,281,298 B2 | 3/2016 | Ray et al. | |
| 9,368,549 B1 | 6/2016 | Oraw et al. | |
| 9,490,407 B2 | 11/2016 | Ray et al. | |
| 10,690,920 B2* | 6/2020 | Cok | H10K 59/131 |
| 2018/0114775 A1* | 4/2018 | Ray | H01L 25/50 |
| 2020/0403118 A1* | 12/2020 | Kim | H10H 20/01 |

FOREIGN PATENT DOCUMENTS

| | | | |
|---|---|---|---|
| CN | 101305478 | | 11/2008 |
| CN | 107210350 | * | 9/2017 |
| JP | 2020155428 | * | 9/2020 |
| KR | 101490758 | | 2/2015 |
| KR | 10-20180095709 | | 8/2018 |

(Continued)

OTHER PUBLICATIONS

Office Action issued in corresponding Korean Application No. 10-2021-0039000, dated Nov. 7, 2022.

*Primary Examiner* — Yasser A Abdelaziez
(74) *Attorney, Agent, or Firm* — NORTON ROSE FULBRIGHT US LLP

(57) ABSTRACT

The present disclosure relates to a light-emitting diode (LED) electrode assembly, and more specifically, to an ultra-thin LED electrode assembly and a manufacturing method thereof.

4 Claims, 17 Drawing Sheets

(56) References Cited

FOREIGN PATENT DOCUMENTS

| | | |
|---|---|---|
| KR | 1020200040959 | 4/2020 |
| KR | 1020200088960 | 7/2020 |
| TW | 201347164 | 11/2013 |
| TW | 201838203 | 10/2018 |
| WO | WO 2021/007408 * | 1/2021 |

* cited by examiner

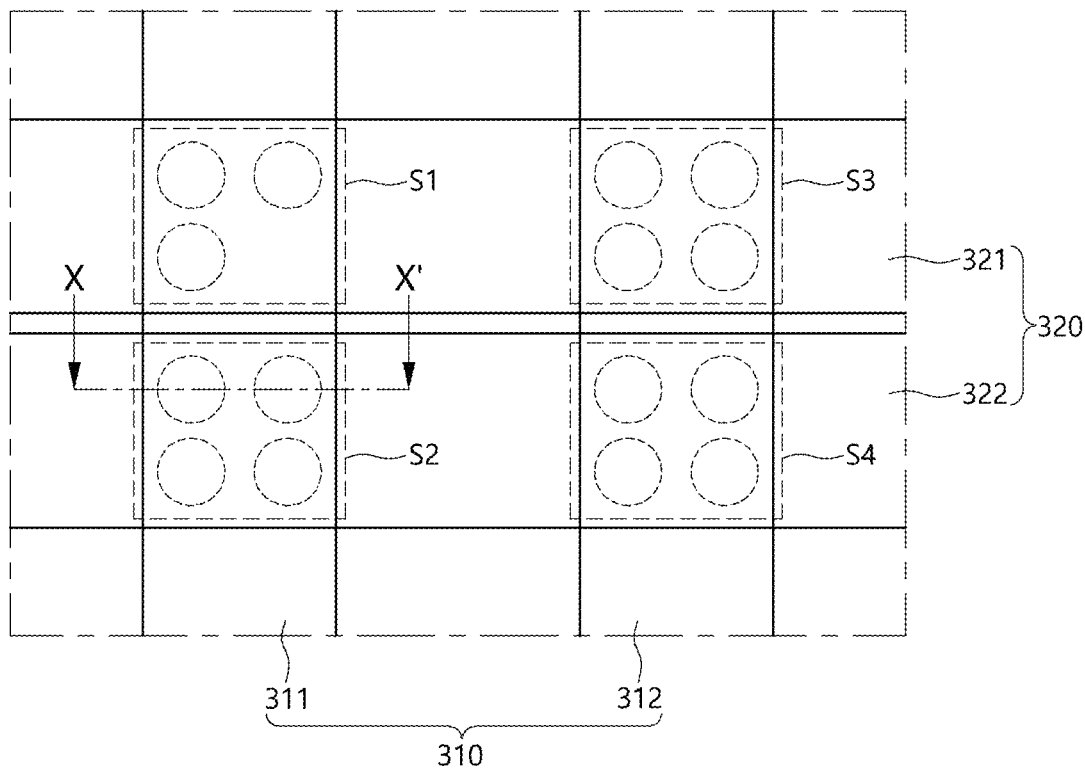
FIG. 1
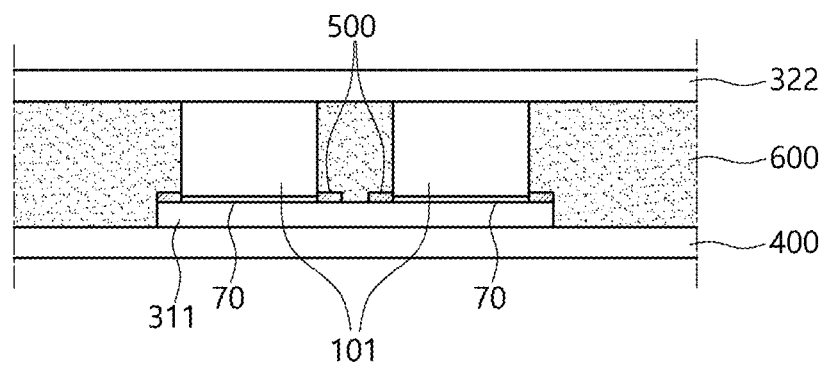
X-X'    FIG. 2 ical and wet etching or growing
ULTRA-THIN LED ELECTRODE ASSEMBLY AND METHOD FOR MANUFACTURING THEREOF

CROSS-REFERENCE TO RELATED APPLICATION

This application claims priority to and the benefit of Korean Patent Application No. 10-2021-0039000, filed on Mar. 25, 2021, the disclosure of which is incorporated herein by reference in its entirety.

BACKGROUND

1. Field of the Invention

The present disclosure relates to a light-emitting diode (LED) electrode assembly, and more specifically, to an ultra-thin LED electrode assembly and a manufacturing method thereof.

2. Discussion of Related Art

A micro light-emitting diode (LED) and a nano LED can realize an excellent feeling of color and high efficiency, and are made of eco-friendly materials, and thus are being used as core materials for various light sources or displays. In line with these market conditions, recently, studies for developing a nanocable LED coated with a shell through a new manufacturing process or a new nanorod LED structure are proceeding. Further, research on a protective film material for achieving high efficiency and high stability of a protective film which covers an outer surface of nanorods, or research and development of a ligand material advantageous for a subsequent process is also proceeding.

In line with research in this material field, a display TV using red, green, and blue micro-LEDs has recently been commercialized. Displays and various light sources using micro-LEDs have advantages of high performance characteristics, a very long theoretical lifespan, and very high efficiency, but since the micro LEDs should be individually disposed on miniaturized electrodes in a limited region, when high unit cost, high process defect rate, and low productivity are considered, due to the limitations of process technology, it is difficult to manufacture an electrode assembly, which is implemented by disposing a micro-LED on the electrode with a pick and place technique, as a true high-resolution commercial display ranging from smartphones to TVs or as a light source having various sizes, shapes, and brightness. Further, it is more difficult to individually dispose a nano-LED, which is smaller than the micro-LED, on an electrode by the pick and place technique as in the micro-LED.

In order to overcome this difficulty, Korean Patent Registration No. 10-1490758 disclosed by the present inventor discloses a process of dropping a solution mixed with a nanorod-type LED on electrodes and then forming an electric field between two different electrodes so that nanorod-type LED elements are magnetically-aligned on the electrodes.

However, in the disclosed technology, since the LED elements are aligned through the electric field, the LED elements should have a rod shape with a large aspect ratio which is formed to be elongated in one direction, but the rod-shaped LED element having a large aspect ratio is quickly sedimented in a solvent, and thus it is difficult to implement the LED element with ink, and accordingly, it is difficult to implement a large-area electrode assembly through inkjet printing.

Further, as the element is assembled by laying on two different electrodes, that is, the element is assembled such that a stacking direction of semiconductor layers in the element and main surfaces of the electrodes are parallel to each other, there is a problem in that a light extraction area is small and thus efficiency is not good. Specifically, for nanorod-type LED elements, a method of manufacturing an LED wafer through a top-down method by mixing a nanopatterning process and dry etching/wet etching or growing the nanorod-type LED element directly on a substrate through a bottom-up method is known. In this nanorod-type LED, since an LED long axis coincides with a stacking direction, that is, a stacking direction of each layer in a p-GaN/InGaN multi-quantum well (MQW)/n-GaN stacked structure, a light emitting area is narrow, and surface defects relatively have a large effect on a decrease in efficiency because the light emitting area is narrow. Also, since it is difficult to optimize a recombination rate of electrons-holes, there is a problem in that luminous efficiency is significantly lower than that of an original wafer.

Further, since two different electrodes formed to emit light from the nanorod-type LED element should be formed on the same plane, there is a problem in that electrode design is not easy.

(Patent Document 1) Korean Patent Registration No. 10-1490758.

SUMMARY OF THE INVENTION

The present disclosure is directed to providing a method of manufacturing an ultra-thin light-emitting diode (LED) electrode assembly capable of easily implementing a large-area LED electrode assembly through an ultra-thin film LED element which is suitable for ink formation, has a large light emitting area, minimizes or prevents efficiency degradation due to surface defects, and has an optimized electron-hole recombination rate, and an ultra-thin LED electrode assembly implemented through the same.

Further, the present disclosure is directed to providing an ultra-thin LED electrode assembly with improved luminance while maintaining high efficiency by increasing a light emitting area and a manufacturing method thereof.

Further, the present disclosure is directed to providing an ultra-thin LED electrode assembly of which an electrode arrangement design and ease of electrode implementation are improved and a manufacturing method thereof.

According to an aspect of the present disclosure, there is provided an ultra-thin light-emitting diode (LED) electrode assembly including: a lower electrode line including a first electrode; a plurality of ultra-thin LED elements each including a first conductive semiconductor layer, a photoactive layer, and a second conductive semiconductor layer, having a ratio of 1:0.5 to 1.5 between a thickness which is a stacking direction of the layers and a length of a long axis in a cross-section perpendicular to the stacking direction, and disposed upright on the first electrode in the stacking direction of the layers; and an upper electrode line including a second electrode disposed on the plurality of ultra-thin LED elements.

According to one embodiment of the present disclosure, the electrode assembly may further include an arrangement inducing layer for disposing the ultra-thin LED element upright in a thickness direction on one side in the thickness direction of the ultra-thin LED element and on either one or both sides of a disposition region where the ultra-thin LED element is disposed on the first electrode, wherein the arrangement inducing layer is a magnetic layer, a charge layer, or a bonding layer.

Further, a maximum surface area of the ultra-thin LED element may be 16 µm² or less.

In addition, the ultra-thin LED element may have a thickness of 2.7 µm or less, more preferably a thickness of 2.0 µm or less, and yet more preferably 0.2 to 1.0 µm.

In addition, the first conductive semiconductor layer may be an n-type III-nitride semiconductor layer in the ultra-thin LED element, and an electron delay layer may be further included on a surface opposite one surface of the first conductive semiconductor layer adjacent to the photoactive layer so that the numbers of electrons and holes recombined in the photoactive layer are balanced.

In addition, the electron delay layer may include one or more selected from the group consisting of CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, Si, poly(para-phenylene vinylene) and a derivative thereof, polyaniline, poly(3-alkylthiophene), and poly(paraphenylene).

In addition, the first conductive semiconductor layer may be a doped n-type III-nitride semiconductor layer, and the electron delay layer may be a III-nitride semiconductor having a lower doping concentration than the first conductive semiconductor layer.

In addition, the electrode assembly may further include a protective film surrounding exposed side surfaces of the ultra-thin LED element.

In addition, the first conductive semiconductor layer of the ultra-thin LED element may be an n-type III-nitride semiconductor layer, the second conductive semiconductor layer may be a p-type III-nitride semiconductor layer, and the electrode assembly may further include at least one film among a hole pushing film surrounding exposed side surfaces of the second conductive semiconductor layer or the exposed side surfaces of the second conductive semiconductor layer and exposed side surfaces of at least a portion of the photoactive layer to move holes at the exposed side surface toward a center, and an electron pushing film surrounding the exposed side surfaces of the first conductive semiconductor layer to move electrons at the exposed side surface toward the center.

In addition, the ultra-thin LED element may include both the hole pushing film and the electron pushing film, and the electron pushing film may be provided as an outermost film surrounding the side surfaces of the first conductive semiconductor layer, the photoactive layer, and the second conductive semiconductor layer.

In addition, the hole pushing film may include one or more selected from the group consisting of $AlN_x$, $ZrO_2$, MoO, $Sc_2O_3$, $La_2O_3$, MgO, $Y_2O_3$, $Al_2O_3$, $Ga_2O_3$, $TiO_2$, ZnS, $Ta_2O_5$, and n-$MoS_2$.

In addition, the electron pushing film may include one or more selected from the group consisting of $Al_2O_3$, $HfO_2$, $SiN_x$, $SiO_2$, $ZrO_2$, $Sc_2O_3$, $AlN_x$, and $Ga_2O_3$.

In addition, according to another aspect of the present disclosure, there is provided a method of manufacturing an ultra-thin LED electrode assembly including: (1) an operation of preparing a lower electrode line including a first electrode; (2) an operation of treating an ink composition including a plurality of ultra-thin LED elements each including a first conductive semiconductor layer, a photoactive layer, and a second conductive semiconductor layer which are stacked, and having a ratio of 1:0.5 to 1.5 between a thickness which is a stacking direction and a length of a long axis in a cross-section perpendicular to the stacking direction, on the first electrode; (3) an operation of assembling the ultra-thin LED elements to be upright in a thickness direction on the first electrode; and (4) an operation of forming an upper electrode line including a second electrode to be electrically connected to a side opposite one side of each of the ultra-thin LED elements assembled on the first electrode.

According to one embodiment of the present disclosure, a magnetic layer may be further provided on one side of the ultra-thin LED element in the thickness direction and on a disposition region in the first electrode where the ultra-thin LED element is disposed, and a magnetic field may be formed in a direction perpendicular to a main surface of the first electrode so that the ultra-thin LED element is moved to the disposition region and disposed upright in the thickness direction in the operation (3).

Further, a first charge layer having a positive charge or negative charge may be further provided on one side of the ultra-thin LED element in the thickness direction, a second charge layer having a charge opposite that of the first charge layer may be further provided on the disposition region in the first electrode where the ultra-thin LED element is disposed, and an electric field may be formed in a direction perpendicular to a main surface of the first electrode so that the ultra-thin LED element is moved to the disposition region and disposed upright in the thickness direction in the operation (3).

In addition, the ultra-thin LED elements may be assembled to be upright on the disposition region through a chemical bond through a bonding layer between one side of the ultra-thin LED element in the thickness direction and the disposition region in the first electrode where the ultra-thin LED element is disposed in the operation (3), and the bonding layer may be provided on one side of the ultra-thin LED element in the thickness direction and on either one or both sides of the disposition region.

Hereinafter, terms used in the present disclosure are defined.

When describing embodiments of the present disclosure, it should be understood that when, a layer, region, or pattern is referred to as being "on," "above," "under," or "below" a substrate, another layer, another region, or another pattern, the terminology of "on," "above," "under," or "below" includes both the meanings of "directly" and "indirectly" "on," "above," "under," or "below."

The present invention has been researched under support of National Research and Development Project, and specific information of National Research and Development Project is as follow:

[Project Series Number] 1711130702
[Project Number] 2021R1A2C2009521
[Government Department Name] Ministry of Science and ICT
[Project Management Authority Name] Korea Evaluation Institute of Industrial Technology
[Research Program Name] Middle-level Researcher Support Project
[Research Project Name] Development of dot-LED material and display source/application technology
[Contribution Ratio]
[Project Execution Organization Name] Kookmin University Industry Academic Cooperation Foundation
[Period of Research] Mar. 1, 2021 to Feb. 28, 2022
[Project Series Number] 1711105790
[Project Number] 2016R1A5A1012966
[Government Department Name] Ministry of Science and ICT

[Project Management Authority Name] National Research Foundation of Korea
[Research Program Name] Science and Engineering Research Center (S/ERC)
[Research Project Name] Circadian ICT research center using hybrid device
[Contribution Ratio]
[Project Execution Organization Name] Kookmin University Industry Academic Cooperation Foundation
[Period of Research] Jan. 1, to Dec. 31, 2021

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIGS. 1 and 2 are views of an ultra-thin light-emitting diode (LED) electrode assembly according to one embodiment of the present disclosure, wherein FIG. 1 is a plan view of the ultra-thin LED electrode assembly, and FIG. 2 is a cross-sectional view taken along line X-X' in FIG. 1;

DETAILED DESCRIPTION OF EXEMPLARY EMBODIMENTS

Figure 3:
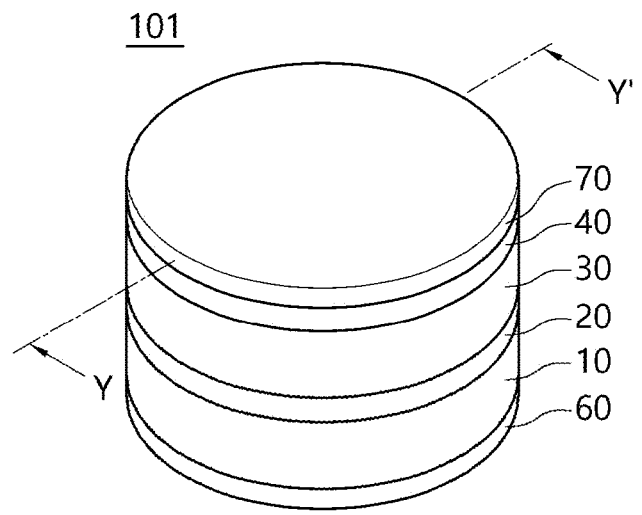
FIG. 3 is a perspective view of an ultra-thin LED element used in one embodiment of the present disclosure.

Hereinafter, embodiments of the present disclosure will be described in detail so that those skilled in the art may easily carry out the embodiments. The present disclosure may be realized in many different shapes and is not limited to the embodiments described herein.

In a description with reference to FIGS. 1 and 2, an ultra-thin light-emitting diode (LED) electrode assembly 1000 according to one embodiment of the present disclosure is implemented by including a lower electrode line 310 including first electrodes 311 and 312, a plurality of ultra-thin LED elements 101 disposed on the first electrodes 311 and 312, and an upper electrode line 320 including second electrodes 321 and 322 disposed to come into contact with upper portions of the ultra-thin LED elements 101.

First, the electrode lines that allow the ultra-thin LED elements to emit light will be described before a detailed description of each component.

The ultra-thin LED electrode assembly 1000 includes the upper electrode line 320 and the lower electrode line 310 disposed to face upper and lower portions with the ultra-thin LED elements 101 interposed therebetween. Since the upper electrode line 320 and the lower electrode line 310 are not arranged in a horizontal direction, electrode design may become very simple, and may be more easily realized by breaking away from complicated electrode lines of the electrode assembly by conventional electric field induction, in which two types of electrodes implemented to have ultra-small thicknesses and widths are disposed to have micro- or nano-scale spacing in a horizontal direction in a plane of a limited area.

Specifically, as shown in FIGS. 1 and 2, irrespective of the electrode design of the lower electrode line 310, since the upper electrode line 320 only needs to be disposed so that electrical contact is possible on the upper surfaces of the disposed ultra-thin LED elements 101, the design or implementation of the electrode is very easy. Specifically, although FIG. 1 illustrates that the second electrodes 321 and 322 are independent, since only one second electrode may be implemented to come into contact with the upper surfaces of all disposed ultra-thin LED elements, there is an advantage that the electrode line may be implemented to be greatly simplified compared to the related art.

Further, the lower electrode line 310 and the upper electrode line 320 may respectively include a plurality of first electrodes 311 and 312 and a plurality of second electrodes 321 and 322, and since the number, intervals, and arrangement shapes thereof may be appropriately modified in consideration of a size of the LED electrode assembly to be implemented, the present disclosure is not particularly limited in this respect.

In addition, when the upper electrode line 320 is designed to electrically come into contact with the upper portions of the ultra-thin LED elements 101 mounted on the lower electrode line 310, there is no limitation in the number, arrangement shapes, and the like. However, as shown in FIG. 1, when lower electrode lines 310 are arranged in parallel in one direction, the upper electrode line 320 may be arranged to be perpendicular to the one direction, and this electrode arrangement is an electrode arrangement widely used in displays and the like in the related art. Thus, there is an advantage in that the electrode arrangement and control technology of the conventional display field may be used as it is.

In addition, since the lower electrode line 310 and the upper electrode line 320 may each have a material, a shape, a width, and a thickness of an electrode used in a typical LED electrode assembly, and may be manufactured using a known method, the present disclosure is not particularly limited in these aspects. For example, the first electrodes 311 and 312 and the second electrodes 321 and 322 may be independently formed of aluminum, chromium, gold, silver, copper, graphene, ITO, or an alloy thereof, and have a width of 2 to 50 µm and a thickness of 0.1 to 100 µm, which may be appropriately changed in consideration of a size and the like of a desired LED electrode assembly.

According to one embodiment of the present disclosure, disposition regions $S_1$, $S_2$, $S_3$, and $S_4$ where the ultra-thin LED elements 101 are disposed may be formed on the first electrodes 311 and 312. The disposition regions $S_1$, $S_2$, $S_3$, and $S_4$ may be set in many different ways depending on the purpose, and may be set to be spaced apart from each other by a predetermined interval as shown in FIG. 1, or an entire region on the first electrodes 311 and 312 may be a disposition region unlike FIG. 1.

Next, the ultra-thin LED elements 101 disposed between the above-described lower electrode line 310 and upper electrode line 320 will be described.

Figure 4:
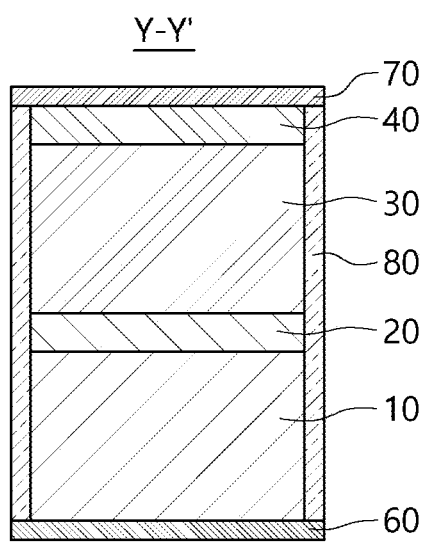
FIG. 4 is a cross-sectional view taken along line Y-Y' in FIG. 3.

In a description with reference to FIGS. 3 and 4, the ultra-thin LED element 101 according to one embodiment of the present disclosure may include a first conductive semiconductor layer 10, a photoactive layer 20, and a second conductive semiconductor layer 30, and in addition, may further include a second electrode layer 60 formed under the first conductive semiconductor layer 10, a first electrode layer 40 formed on the second conductive semiconductor layer 30, and an arrangement inducing layer 70 formed at an outermost side of the second conductive semiconductor layer 30.

The above-described layers are stacked in any one direction, and a ratio between a thickness in a stacking direction and a length of a long axis in a cross-section perpendicular to the stacking direction may satisfy 1:0.5 to 1.5, preferably, 1:0.8 to 1.2, and more preferably, 1:0.9 to 1.1, and accordingly, when the ultra-thin LED element is implemented with inkjet ink, the ultra-thin LED element exhibits excellent dispersibility in a dispersion medium and may be advantageous for maintaining a dispersed state without sedimentation for a long time. Further, since there is no need for a separate additive for maintaining the dispersed state due to a geometric structure suitable for ink formation, there is an advantage in that contamination of the lower electrode line 310 or a circuit board due to the separate additive may be prevented in advance. Further, when ink containing the ultra-thin LED element is printed on the lower electrode line 310, most of the conventional nanorod-type LED elements with a large aspect ratio are disposed on the electrode in a lying down state, on the other hand, there is an advantage in that the probability that the ultra-thin LED elements are arranged in the lying down state on the electrode may be reduced. In addition, when the LED elements are assembled on the electrode in the thickness direction, since the probability that the plurality of elements are assembled in different directions, in other words, the probability that a p-type conductive semiconductor layer and an n-type conductive semiconductor layer are assembled on the first electrode in different directions, is reduced, it is possible to reduce electrical leakage caused by reverse arrangement, and accordingly, there is an advantage that a lifespan may be improved. Here, the length of the long axis refers to a diameter when a shape of the cross-section is a circular shape, refers to a length of a long axis when the shape of the cross-section is an elliptical shape, and refers to a length of the longest side when the shape of the cross-section is a polygonal shape. Meanwhile, when the cross-sections of the ultra-thin LED elements are not the same in the thickness direction, the cross-section refers to the largest cross-section.

Further, a ratio between a length of a short axis and the length of the long axis in the cross section may also satisfy 1:0.5 to 1.5, preferably 1:0.8 to 1.2, and more preferably, 1:0.9 to 1.1, and through this, a purpose of the present disclosure described above may be easily achieved. Even when the ratio between the thickness and the length of the long axis satisfies 1:0.5 to 1.5, when the ratio between the length of the short axis and the length of the long axis in the cross section departs from 1:0.5 to 1.5, it is difficult to maintain the dispersed state of the LED element in the dispersion medium for a long time, and thus the LED element may be unsuitable for ink formation. Further, in order to maintain a dispersed state of the LED element having a geometric structure unsuitable for ink formation in the dispersion medium for a long period, an additive should be further contained, and thus, there is a risk of contamination of a driving electrode or circuit board due to use of the additive. Here, the length of the short axis in the cross section refers to the longest length among the lengths of axes perpendicular to the long axis.

Meanwhile, although the ultra-thin LED element 101 shown in FIG. 3 has the same cross-sectional size perpendicular to the stacking direction of the layers, the size of the cross-section is not limited thereto, and the size of the cross-section may be different according to the thickness.

Further, a shape of the ultra-thin LED element 101 may be cylindrical as shown in FIG. 3, but is not limited thereto, and it should be noted that not only polyhedrons such as a hexahedron, an octahedron, a decahedron, and the like but also irregular shapes with star-shaped faces are acceptable.

According to one embodiment of the present disclosure, the ultra-thin LED element 101 has excellent dispersion retention performance capable of maintaining the dispersed state due to a slow sedimentation rate during the ink formation, and thus may have a maximum surface area of 16 $\mu m^2$ or less, more preferably, 9 $\mu m^2$ or less, still more preferably, 4 $\mu m^2$ or less, and yet more preferably, 0.1 to 2.5 $\mu m^2$. Here, the maximum surface area refers to a maximum value among areas of a vertical projection surface for the ultra-thin LED element. When the maximum surface area exceeds 16 $\mu m^2$, the sedimentation rate is high, and thus there is a risk that dispersion retention performance is lowered, and there may be limitations in that the LED element is not suitable to be manufactured as an ink, a separate additive is further added for the ink formation, or a specific dispersion medium should be used.

According to one embodiment of the present disclosure, the ultra-thin LED element may have a thickness of 2.7 µm or less, more preferably a thickness of 2.0 µm or less, and yet more preferably 0.2 to 1.0 µm, and through this, it may be more suitable for maintaining the dispersed state for a long time during ink formation.

However, in the case of the LED element, when the thickness is implemented to be thin, since a position where electrons and holes are combined departs from the photoactive layer 20, luminous efficiency may be lowered. Specifically, when the ultra-thin LED elements are implemented by etching a large-area LED wafer, thicknesses of the first conductive semiconductor layer, the photoactive layer, and the second conductive semiconductor layer are already determined in the state of the LED wafer, and since the ultra-thin LED elements are implemented to achieve a certain level of luminous efficiency by etching only a part of each layer in the wafer differently from the previously determined thickness, this problem inevitably occurs. Such a change in position where the electrons and holes are combined is caused by a difference in velocity of the electrons and the holes moving through the conductive semiconductor layer. For example, since the mobility of the electrons is 200 $cm^2/Vs$ in an n-type GaN conductive semiconductor layer, whereas the mobility of holes is only 5 $cm^2/Vs$ in a p-type GaN conductive semiconductor layer, due to such an electron-hole velocity imbalance, the combining position of the electrons and the holes may vary and may depart from the photoactive layer according a thickness of a p-type GaN conductive semiconductor layer and a thickness of an n-type GaN conductive semiconductor layer.

Figure 6:
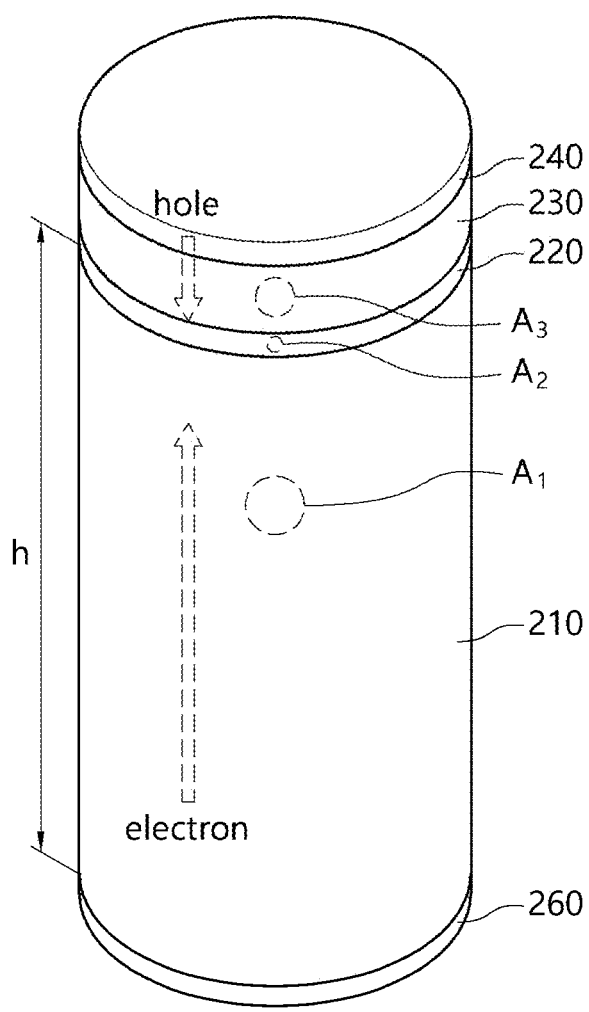
FIG. 6 is a schematic view for describing the balance of electrons and holes in the LED element.

In a description with reference to FIG. 6, in an LED element 200 having a diameter of approximately 600 nm in which an n-type GaN conductive semiconductor layer 210, a photoactive layer 220, and a p-type GaN conductive semiconductor layer 230 are stacked, in consideration of the electron mobility of the n-type GaN conductive semiconductor layer 210 and the hole mobility of the p-type GaN conductive semiconductor layer 230, a thickness h of the n-type GaN conductive semiconductor layer 210 should be inevitably thick when the thickness is designed so that the numbers of electrons and holes recombined at a point $A_2$ in the photoactive layer 220 are balanced, and accordingly, unless the thickness of the p-type GaN conductive semiconductor layer 230 is very thin, the rod-type LED element is very likely to be implemented. In other words, in the case of an LED element in which the thickness of each layer is designed so that a position where the numbers of electrons and holes, which are recombined, are balanced becomes the photoactive layer 220, the aspect ratio between the thickness of the LED element and the length of the long axis of the cross section becomes larger as the length of the long axis of the cross section perpendicular to a thickness direction is shorter, and accordingly, the LED element may be inappropriate to implemented with ink even when the numbers of holes and electrons recombined in the photoactive layer are balanced. Further, when the thickness of the n-type GaN conductive semiconductor layer 210 is implemented to be thin to be suitable for implementation with ink, since a position where the numbers of recombination electrons and holes are balanced may be achieved at a point $A_3$ in the p-type GaN conductive semiconductor layer 230, luminous efficiency may be lowered.

Accordingly, the ultra-thin LED element provided in one embodiment of the present disclosure may have a geometric structure suitable for being implemented with ink, and may further include an electron delay layer adjacent to the n-type conductive semiconductor layer to prevent a decrease in luminous efficiency as the numbers of holes and electrons recombined in the photoactive layer are balanced. In a description with reference to FIG. 7, when the first conductive semiconductor layer is an n-type conductive semiconductor, an ultra-thin LED element may include an electron delay layer 50 on the first conductive semiconductor layer 10, and accordingly, even when the thickness of the first conductive semiconductor layer 10 is implemented to be thin, it is possible to prevent the decrease in luminous efficiency. Further, there is an advantage in that the reduced thickness of the first conductive semiconductor layer 10 may allow to reduce the probability that electrons are captured by surface defects while moving in the thickness direction of the first conductive semiconductor layer 10 to minimize light emission loss.

The electron delay layer 50 may contain, for example, one or more selected from the group consisting of CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, Si, poly(para-phenylene vinylene) and a derivative thereof, polyaniline, poly(3-alkylthiophene), and poly(paraphenylene). Further, a thickness of the electron delay layer 50 may range from 1 to 100 nm, but is not limited thereto, and may be appropriately changed in consideration of a material of the n-type conductive semiconductor layer, a material of the electron delay layer, and the like.

Hereinafter, each layer of the ultra-thin LED elements 101 and 102 according to one embodiment of the present disclosure will be described in detail.

One of the first conductive semiconductor layer 10 and the second conductive semiconductor layer 30 may be an n-type semiconductor layer, and the other may be a p-type semiconductor layer, and known semiconductor layers employed in a light emitting diode may be used as the n-type semiconductor layer and the p-type semiconductor layer without limitation. For example, the n-type semiconductor layer and the p-type semiconductor layer may include Group III-V semiconductors referred to as III-nitride materials, specifically, binary, ternary and quaternary alloys of gallium, aluminum, indium, and nitrogen.

For example, the first conductive semiconductor layer 10 may be an n-type semiconductor layer, and in this case, the n-type semiconductor layer may include one or more selected from semiconductor materials having a composition formula of $In_xAl_yGa_{1-x-y}N$ (0≤x≤1, 0≤y≤1, 0≤x+y≤1), for example, InAlGaN, GaN, AlGaN, InGaN, AlN, InN, and the like, and may be doped with a first conductive dopant (for example, Si, Ge, Sn, or the like). According to a preferable embodiment of the present disclosure, the thickness of the first conductive semiconductor layer 10 may be 50 to 150 nm, but is not limited thereto.

Further, the second conductive semiconductor layer 30 may be a p-type semiconductor layer, and in this case, the p-type semiconductor layer may include one or more selected from semiconductor materials having a composition formula of $In_xAl_yGa_{1-x-y}N$ (0≤x≤1, 0≤y≤1, 0≤x+y≤1), for example, InAlGaN, GaN, AlGaN, InGaN, AlN, InN, and the like, and may be doped with a second conductive dopant (for example, Mg). According to a preferable embodiment of the present disclosure, the thickness of the second conductive semiconductor layer 30 may be 100 to 1800 nm, but is not limited thereto.

Further, the photoactive layer 20 located between the first conductive semiconductor layer 10 and the second conductive semiconductor layer 30 may have a single or multiple quantum well structure. The photoactive layer 20 may be used without limitation in the case of a photoactive layer included in a common LED element used for lighting, displays, and the like. A clad layer (not shown) doped with a conductive dopant may be formed on and/or under the photoactive layer 20, and the clad layer doped with the conductive dopant may be implemented as an AlGaN layer or an InAlGaN layer. In addition, a material such as AlGaN or AlInGaN may be used as the photoactive layer 20. In the photoactive layer 20, when an electric field is applied to the element, electrons and holes move from the conductive semiconductor layers respectively located above and below the photoactive layer to the photoactive layer, and electron-hole pairs are combined in the photoactive layer, and thus, light is emitted. According to a preferable embodiment of the present disclosure, the thickness of the photoactive layer 20 may be 50 to 200 nm, but is not limited thereto.

Meanwhile, the second electrode layer 60 may be provided under the above-described first conductive semiconductor layer 10. Alternatively, the electron delay layer 50 may be further provided between the first conductive semiconductor layer 10 and the second electrode layer 60. In addition, the first electrode layer 40 may be provided on the above-described second conductive semiconductor layer 30.

Figure 7:
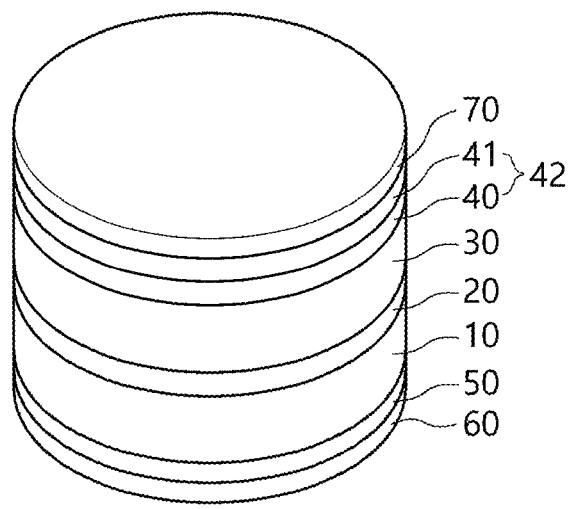
FIG. 7 is a perspective view of the ultra-thin LED element used in one embodiment of the present disclosure.

The first electrode layer 40 and the second electrode layer 60 may be used without limitation in the case of electrode layers included in common LED elements used for lighting, displays, and the like. The first electrode layer 40 and the second electrode layer 60 are each independently a single layer formed of one of Cr, Ti, Al, Au, Ni, ITO, and an oxide or alloy thereof, a single layer in which two or more are mixed, or a composite layer in which two or more materials are each layered. For example, the ultra-thin LED element 102 may include a first electrode composite layer 42 the first electrode layer 40, which is an ITO layer, and a Ti/Au composite layer 41 are stacked on the second conductive semiconductor layer 30 as shown in FIG. 7. Further, the first electrode layer 40 and the second electrode layer 60 may each independently have a thickness of 10 to 500 nm, but are not limited thereto.

In addition, an arrangement inducing layer for arranging the ultra-thin LED element in an upright state may be formed on one side of the ultra-thin LED element in the thickness direction and on one side or both sides of the disposition regions S1, S2, S3, and S4 where the ultra-thin LED element are disposed on the first electrodes 311 and 312. The arrangement inducing layer induces the ultra-thin LED element 101 to move to a desired region on the first electrodes 311 and 312, for example, the disposition regions S1, S2, S3, and S4, and serves to arrange the ultra-thin LED element 101 in an upright state on the first electrodes 311 and 312. The arrangement inducing layer may be formed on the ultra-thin LED elements 101 and/or on a desired region of the first electrodes 311 and 312, for example, on the disposition regions S1, S2, S3, and S4.

When describing the case in which the arrangement inducing layer is formed only on the first electrodes 311 and 312, the arrangement inducing layer may be a bonding layer which may be chemically bonded to a metal part of the ultra-thin LED element 101, for example, the first electrode layer and/or the second electrode layer. In this case, the bonding layer may be, for example, a layer formed so that a thiol group is exposed to the outside.

Figure 5A:
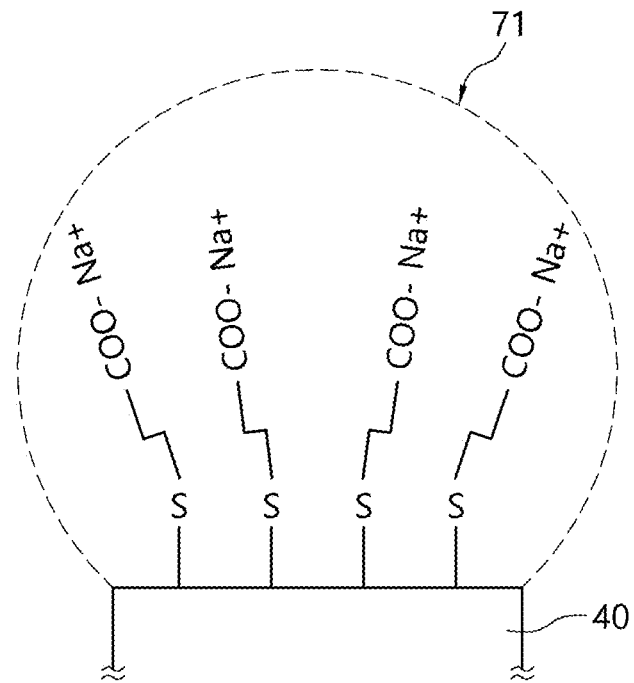
FIGS. 5A to 5C are views of various embodiments for an arrangement inducing layer which may be provided in the ultra-thin LED element used in one embodiment of the present disclosure.
Figure 5B:
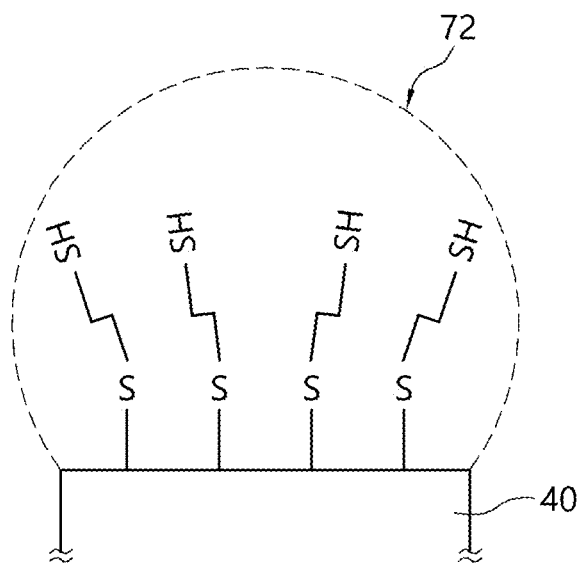
Figure 5C:
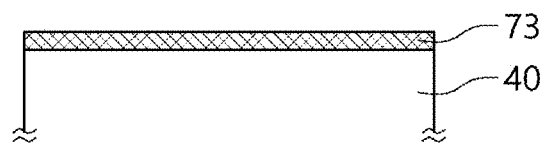

Further, when describing the case in which the arrangement inducing layer is formed on the ultra-thin LED element 101, as shown in FIG. 3 and FIGS. 5A to 5C, the arrangement inducing layer 70 may be further included on the first electrode layer 40. A material of the arrangement inducing layer 70 may vary according to a specific induction and bonding method. For example, the arrangement inducing layer 70 may be a charge layer having a positive charge or negative charge, and specifically, may be a charge layer 71 having a negative charge as shown in FIG. 5A. The charge layer 71 may allow the ultra-thin LED elements to be induced to the first electrode, arranged upright, and assembled through an electrophoresis method to be described below. Alternatively, as shown in FIG. 5B, the arrangement inducing layer may be a bonding layer 72, and a functional group exposed to the bonding layer 72 may be chemically bonded to other functional groups provided on the first electrode, or may be bonded to the first electrode made of a metal material through chemical bonding, for example, adsorption. Further, the arrangement inducing layer 70 may be a magnetic layer 73 as shown in FIG. 5C, and the magnetic layer 73 may be assembled on the first electrodes 311 and 312 under a magnetic field.

Meanwhile, when the arrangement inducing layer 70 provided on the ultra-thin LED element is the charge layer 71, a charge layer having a charge opposite the charge of the charge layer 71 provided on the ultra-thin LED element may be provided on the disposition regions in the first electrodes 311 and 312, and accordingly, there is an advantage in that the ultra-thin LED element may be induced to the disposition regions better while the ultra-thin LED element may be better induced to be upright. The charge layer is not limited when formed of a material suitable for forming a layer or a film while having a positive charge or negative charge.

Further, even when the arrangement inducing layer 70 provided on the ultra-thin LED element is the magnetic layer 73, a magnetic layer may be further included on the disposition regions in the first electrodes 311 and 312, and accordingly, there is an advantage in that the ultra-thin LED element may be induced to the disposition regions better while the ultra-thin LED element may be better induced to be upright. The magnetic layer may be a ferromagnetic material or a paramagnetic material.

Meanwhile, in FIGS. 3 and 4, although the arrangement inducing layer 70 is shown to be located on the first electrode layer 40, the present disclosure is not limited thereto, and the arrangement inducing layer 70 may be located on the second electrode layer 60. In other words, the arrangement inducing layer 70 may be provided on one side of the ultra-thin LED element in the thickness direction, that is, the uppermost layer or the lowermost layer.

Further, the ultra-thin LED element 101 may further include a protective film 80 surrounding the side surfaces of the element when a surface parallel to the stacking direction is referred to as a side surface. The protective film 80 performs a function of protecting the surfaces of the first conductive semiconductor layer 10, the photoactive layer 20, and the second conductive semiconductor layer 30. Further, in a process of separating a plurality of LED pillars after etching the LED wafer in the thickness direction like the following method of manufacturing an ultra-thin LED element, the protective film 80 may serve to protect the first conductive semiconductor layer 10. The protective film 80 may include, for example, one or more among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN). A thickness of the protective film 80 may be 5 nm to 100 nm, and more preferably, 30 nm to 100 nm, which may be advantageous in protecting the first conductive semiconductor layer 10 in the following process of separating the LED pillars.

Figure 8:
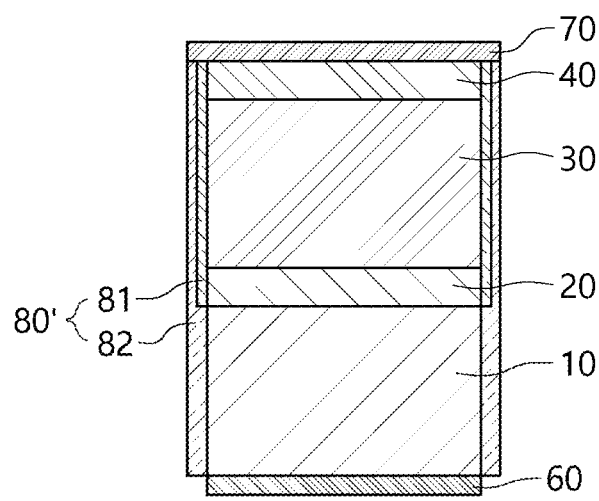
FIG. 8 is a cross-sectional view of the ultra-thin LED element used in one embodiment of the present disclosure.

Meanwhile, as shown in FIG. 8, an ultra-thin LED element 103 according to one embodiment of the present disclosure may include a protective film 80' composed of a hole pushing film 81 surrounding exposed side surfaces of the second conductive semiconductor layer 30 or the exposed side surfaces of the second conductive semiconductor layer 30 and exposed side surfaces of at least a portion of the photoactive layer 20 to move holes at the exposed side surface toward the center, and an electron pushing film 82 surrounding exposed side surfaces of the first conductive semiconductor layer 10 to move electrons at the exposed side surface toward the center to have improved luminous efficiency in addition to a protective function as a protective film.

Some of the charges moving from the first conductive semiconductor layer 10 to the photoactive layer 20 and some of the holes moving from the second conductive semiconductor layer 30 to the photoactive layer 20 may move along the side surface, and in this case, quenching of the electrons or holes may occur due to defects present on the surface, and accordingly, luminous efficiency may be lowered. In this case, even when the protective film is provided, there is a problem in that quenching is unavoidable due to defects occurring on an element surface before the protective film is provided. However, when the protective film 80' is composed of the hole pushing film 81 and the electron pushing film 82, the electrons and the holes are concentrated toward the center of the element to be induced to move in a direction of the photoactive layer, and thus, there is an advantage in that loss of luminous efficiency due to the surface defects may be prevented even when the surface has the defects before the protective film is formed.

The hole pushing film 81 may include, for example, at least one selected from the group consisting of $AlN_x$, $ZrO_2$, MoO, $Sc_2O_3$, $La_2O_3$, MgO, $Y_2O_3$, $Al_2O_3$, $Ga_2O_3$, $TiO_2$, ZnS, $Ta_2O_5$, and n-$MoS_2$, and the electron pushing film 82 may include at least one selected from the group consisting of $Al_2O_3$, $HfO_2$, $SiN_x$, $SiO_2$, $ZrO_2$, $Sc_2O_3$, $AlN_x$, and $Ga_2O_3$.

Further, as shown in FIG. 8, when the ultra-thin LED element includes both the hole pushing film 81 and the electron pushing film 82, the electron pushing film 82 may be provided as an outermost film surrounding the side surfaces of the first conductive semiconductor layer 10, the photoactive layer 20, and the second conductive semiconductor layer 30.

In addition, the hole pushing film 81 and the electron pushing film 82 may each independently have a thickness of 1 to 50 nm.

Meanwhile, it should be noted that the first conductive semiconductor layer 10, the photoactive layer 20, and the second conductive semiconductor layer 30 of the above-described ultra-thin LED element may be included as minimum components of an ultra-thin film LED element, and another phosphor layer, a quantum dot layer, another active layer, a semiconductor layer, a hole blocking layer and/or an electrode layer may be further included on/under each layer.

The above-described ultra-thin LED electrode assembly 1000 may be manufactured by the following manufacturing method. Specifically, the ultra-thin LED electrode assembly 1000 may be manufactured by including (1) an operation of preparing a lower electrode line including a first electrode, (2) an operation of treating an ink composition including a plurality of ultra-thin LED elements each including a first conductive semiconductor layer, a photoactive layer, and a second conductive semiconductor layer which are stacked, and having a ratio of 1:0.5 to 1.5 between a thickness which is a stacking direction and a length of a long axis in a cross-section perpendicular to the stacking direction, on the first electrode, (3) an operation of assembling the ultra-thin LED elements to be upright on the first electrode in the thickness direction, and (4) an operation of forming an upper electrode line including a second electrode to be electrically connected to a side opposite to one side of the ultra-thin LED elements assembled on the first electrode. Hereinafter, descriptions of the above-described ultra-thin LED electrode assembly 1000 in the description of the manufacturing method will be omitted.

As the operation (1) according to the present disclosure, an operation of preparing a lower electrode line 310 including first electrodes 311 and 312 is performed.

The first electrodes 311 and 312 may be implemented in various known electrode patterns through a known method, and the present disclosure is not particularly limited in this respect. For example, as shown in FIG. 1, the plurality of first electrodes 311 and 312 may be implemented in a pattern in which the electrodes are spaced apart from each other at a predetermined interval and arranged in parallel. The first electrodes 311 and 312 may be formed on a substrate 400, and the substrate 400 may be, for example, any one of a glass substrate, a quartz substrate, a sapphire substrate, a plastic substrate, and a flexible polymer film which may be bent. As another example, the substrate 400 may be transparent. However, the substrate 400 is not limited to the listed types, all substrates on which an electrode may be formed may be used.

An area of the substrate 400 is not limited and may vary in consideration of the areas of the first electrodes 311 and 312 formed on the substrate 400. Further, a thickness of the substrate 400 may be 100 μm to 1 mm, but is not limited thereto.

Next, as the operation (2) according to the present disclosure, an operation of treating an ink composition including a plurality of ultra-thin LED elements 101 each including a first conductive semiconductor layer 10, a photoactive layer 20, and a second conductive semiconductor layer which are stacked, and having a ratio of 1:0.5 to 1.5 between a thickness which is a stacking direction and a length of a long axis in a cross-section perpendicular to the stacking direction, on the first electrodes 311 and 312 is performed.

Figure 9:
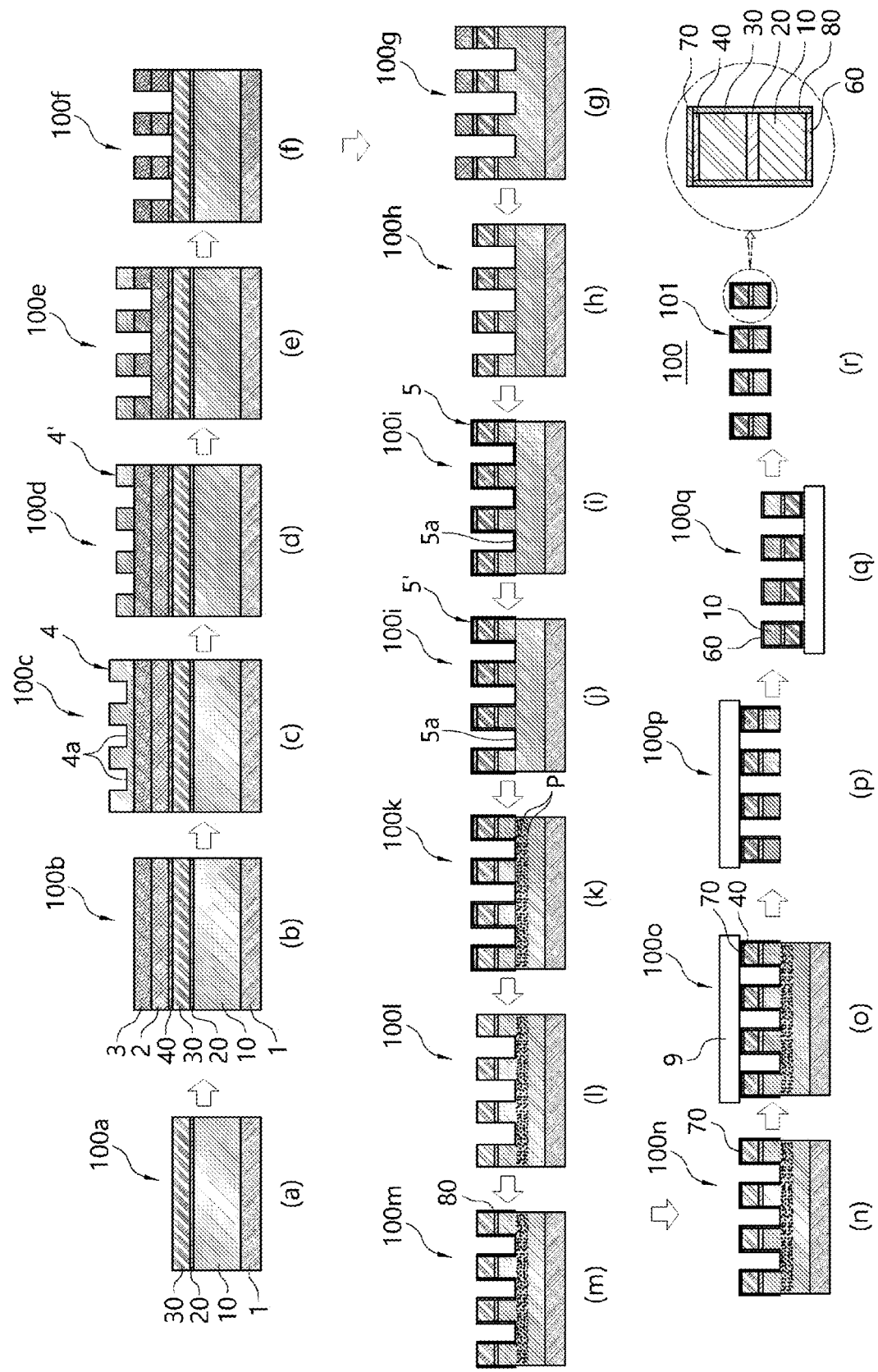
FIGS. 9 and 10 are schematic views for Method 1 of manufacturing the ultra-thin LED element used in one embodiment of the present disclosure.
Figure 10:
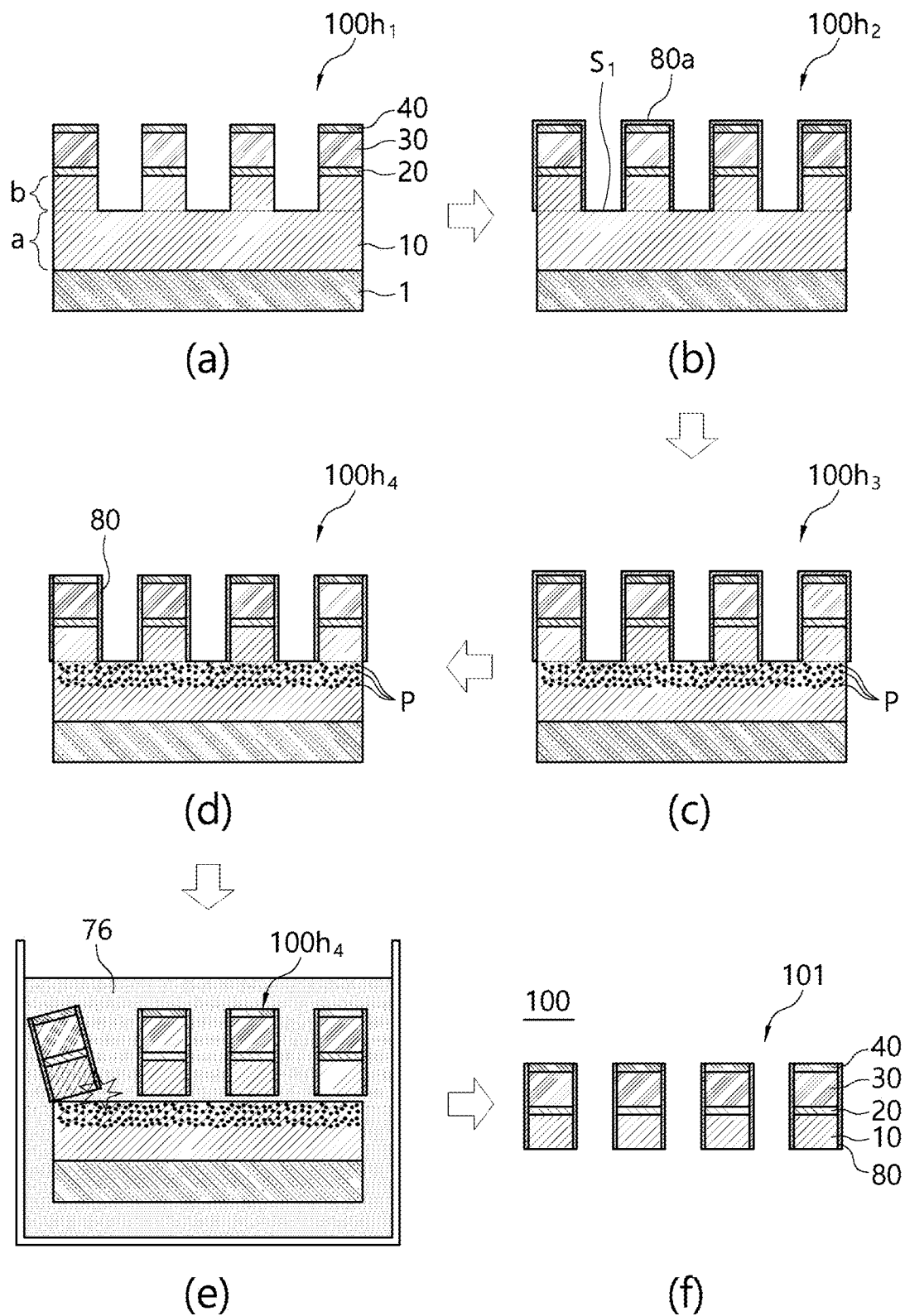
Figure 11:
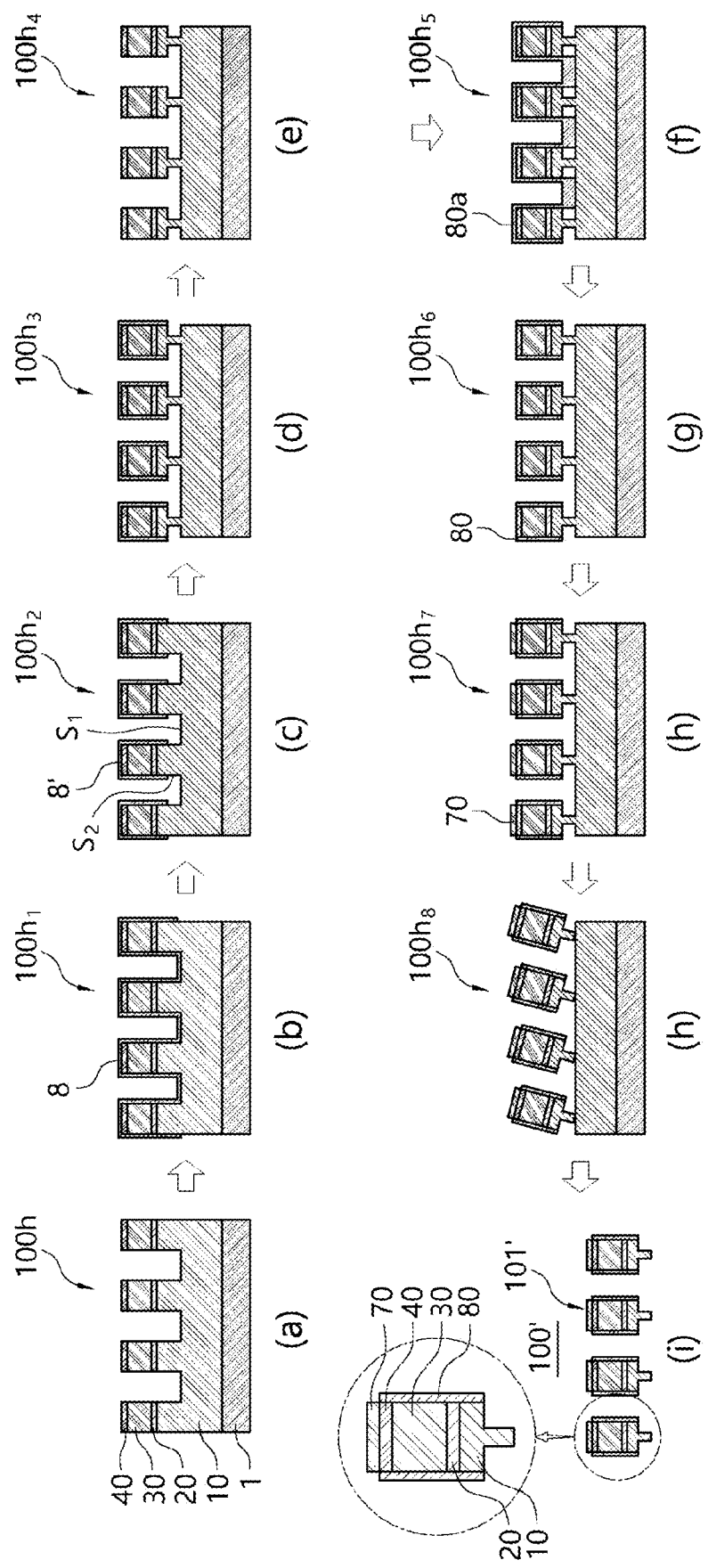
FIG. 11 is a schematic view for Method 2 of manufacturing the ultra-thin LED element used in one embodiment of the present disclosure.

The plurality of ultra-thin film LED elements 101 are prepared as an ink composition in which the plurality of ultra-thin film LED elements 101 are implemented with ink, and an ultra-thin-film LED element assembly 100 formed of the plurality of ultra-thin LED elements 101 may be manufactured through Manufacturing Method 1 shown in FIGS. 9 and 10 or Manufacturing Method 2 shown in FIG. 11. Manufacturing Method 1 may be usefully selected when an n-type III-nitride semiconductor layer is a doped n-type III-nitride semiconductor layer, and Manufacturing Method 2 may be useful when an n-type III-nitride semiconductor layer is not doped.

Manufacturing Method 1 and Manufacturing Method 2 are common up to a process of manufacturing a wafer (100h in FIG. 9, and 100h in FIG. 11) including a plurality of LED structures from an LED wafer 100a, and differ in a method of separating the formed LED structures from the wafer. Up to the process of manufacturing the wafer (100h in FIG. 9, and 100h in FIG. 11) including a plurality of LED structures from the LED wafer 100a, Manufacturing Method 1 will be used for description.

First, Manufacturing Method 1 will be described with reference to FIG. 9. Manufacturing Method 1 may include (A) an operation of preparing the LED wafer 100a (FIG. 9A), (B) an operation of patterning an upper portion of the LED wafer 100a so that a planar surface perpendicular to a direction in which layers are stacked in an individual LED structure has a desired shape and size (FIGS. 9B and 9C), and then forming a plurality of LED structures by etching the LED wafer 100a in the vertical direction to at least a partial thickness of the first conductive semiconductor layer 10 (FIGS. 9D to 9H), and (C) an operation of forming a protective film so as to surround an exposed surface of each of the plurality of LED structures and expose upper surfaces of first portions between adjacent LED structures to the outside (FIGS. 9I and 9J), (D) an operation of forming a plurality of pores in the first portions by immersing the LED wafer in an electrolyte, electrically connecting the LED wafer to one terminal of a power supply, electrically connecting the other electrode of the power supply to an electrode immersed in the electrolyte, and then applying power (FIG. 9K), and (E) an operation of separating the plurality of LED structures from the first portion in which the plurality of pores are formed by applying ultrasonic waves to the LED wafer (FIG. 9O).

A wafer that is commercialized and available may be used as the LED wafer 100a prepared in the operation (A) without limitation. For example, the LED wafer 100a may minimally include a substrate 1, a first conductive semiconductor layer 10, a photoactive layer 20, and a second conductive semiconductor layer 30. In this case, the first conductive semiconductor layer 10 may be an n-type III-nitride semiconductor layer, and the second conductive semiconductor layer 30 may be a p-type III-nitride semiconductor layer. Further, since the LED structures remaining on the LED wafer after the n-type III-nitride semiconductor layer is etched to a desired thickness may be separated through the operations (C) to (E), the thickness of the n-type III-nitride semiconductor layer in the LED wafer is also not limited, and the presence or absence of a separate sacrificial layer may not be considered when selecting the wafer.

Further, each layer in the LED wafer 100a may have a c-plane crystal structure. In addition, the LED wafer 100a may have undergone a cleaning process, since the cleaning process may appropriately employ a common cleaning solution and process of a wafer, the present disclosure is not particularly limited is this respect. The cleaning solution may be, for example, isopropyl alcohol, acetone, and hydrochloric acid, but is not limited thereto.

Next, before the operation (B) is performed, an operation of forming a first electrode layer 40 on the second conductive semiconductor layer 30, which is a p-type III-nitride semiconductor layer, may be performed. The first electrode layer 40 may be formed by a common method of forming an electrode on a semiconductor layer, and may be formed by, for example, deposition through sputtering. As described above, the material of the first electrode layer 40 may be, for example, ITO and may be formed with a thickness of approximately 150 nm. The first electrode layer 40 may be further undergo a rapid thermal annealing process after the deposition process, for example, the first electrode layer 40 may be processed at 600° C. for ten minutes, but since the rapid thermal annealing process may be appropriately adjusted in consideration of the thickness and material of the electrode layer, the present disclosure is not specifically limited thereto.

Next, as the operation (B), in the individual LED structure, the upper portion of the LED wafer may be patterned so that a planar surface perpendicular to the direction in which layers are stacked has a desired shape and size (FIGS. 9B and 9C). Specifically, a mask pattern layer may be formed on the upper surface of the first electrode layer 40, and the mask pattern layer may be formed using a known method and material used in etching an LED wafer, and a pattern of the pattern layer may be formed by appropriately applying a common photolithography method or nanoimprinting method.

For example, as shown in FIG. 9F, the mask pattern layer may be a stack of a first mask layer 2, a second mask layer 3, and a resin pattern layer 4' in which a predetermined pattern is formed on the first electrode layer 40. In a brief description of a method of forming the mask pattern layer, for example, the mask pattern layer may be formed by forming the first mask layer 2 and the second mask layer 3 on the first electrode layer 40 through deposition, forming a resin layer 4, which is an origin of the resin pattern layer 4', on the second mask layer 3 (FIGS. 9B and 9C), removing a remaining resin portion 4a of the resin layer 4 through a common method such as RIE (reactive ion etching) or the like (FIG. 9D), and then sequentially etching the second mask layer 3 and the first mask layer 2 according to the pattern of the resin pattern layer 4' (FIGS. 9E and 9F). In this case, the first mask layer 2 may be formed of, for example, silicon dioxide, and the second mask layer 3 may be a metal layer formed of aluminum, nickel, or the like and the etching thereof may be respectively performed through RIE and inductively coupled plasma (ICP). Meanwhile, when the first mask layer 2 is etched, the resin pattern layer 4' may also be removed (See 100f).

Further, the resin layer 4, which is the origin of the resin pattern layer 4', may be formed through a nanoimprinting method, and after manufacturing a mold corresponding to a desired predetermined pattern mold, and then forming the resin layer by treating the mold with a resin, the resin layer 4 may be transferred on the first electrode layer 40 so that the resin layer 4 may be located on a wafer stack 100b in which the first mask layer 2 and the second mask layer 3 are formed, and then the mold may be removed to implement a wafer stack 100c in which the resin layer 4 is formed.

Meanwhile, the method of forming the pattern through the nanoimprinting method has been described, but the present disclosure is not limited thereto, and the pattern may be formed through photolithography using a known photosensitive material, or may be formed through known laser interference lithography, electron beam lithography, or the like.

Thereafter, as shown in FIG. 9G an LED wafer 100g formed with an LED structure may be manufactured by etching up to a partial thickness of the first conductive semiconductor layer 10, which is an n-type III-nitride semiconductor layer, in a direction perpendicular to a surface of an LED wafer 100f according to the patterns of the mask pattern layers 2 and 3 formed on the first electrode layer 40, and in this case, the etching may be performed through a common dry etching method such as inductively coupled plasma (ICP) and KOH/TMAH wet etching. In this etching process, the second mask layer 3 made of Al constituting the mask pattern layer may be removed, and then an LED wafer 100h formed with a plurality of LED structures may manufactured through removal of the first mask layer 2, which is made of silicon dioxide constituting the mask pattern layer present on the first electrode layer 40 of each LED structure in the LED wafer 100g.

Next, as the operation (C), an operation of forming a protective film 80a so as to surround the exposed surfaces of each of the plurality of LED structures formed on the LED wafer 100h with a predetermined thickness and expose upper surfaces S1 of first portions (a) between adjacent LED structures to the outside is performed (FIGS. 9I and 9J). The protective film 80a is provided to prevent damage to the LED structure while the following operation (D) is performed, and in addition, when the protective film 80a continues to remain on a side surface of the LED structure separated from the LED wafer, the protective film 80a may even perform a function of protecting the side surface of the individually separated LED structure from external stimuli.

When describing the operations (C) to (E) with reference to FIG. 10, specifically, the operation (C) may be performed through an operation of depositing a protective film material and forming the protective film 80*a* on the LED wafer 100*h* formed with the plurality of LED structures so that the protective film 80*a* surrounds the exposed surfaces of each of the plurality of LED structure with a predetermined thickness (an operation (C-1)), and an operation of exposing the upper surface S1 of the first portion (a) between adjacent LED structures to the outside by removing the protective film deposited on the upper surface S1 of the first portion (a) between the LED structures (an operation (C-2)).

The operation (C-1) is an operation of depositing the protective film material on the LED wafer 100*h* formed with the plurality of LED structures (FIG. 10A). In this case, the protective film material may be a known material which is not chemically damaged by an electrolyte in the following operation (D), and for example, the material of the above-mentioned protective film 80 may be used without limitation, and may include, for example, one or more selected from the group consisting of silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), lanthanum oxide ($La_2O_3$), scandium oxide ($Sc_2O_3$), titanium dioxide ($TiO_2$), aluminum nitride (AlN), and gallium nitride (GaN). Further, a thickness of the protective film 80*a* formed through the deposition of the protective film material may range from 5 to 100 nm, and more preferably, from 30 to 100 nm. When the thickness of the protective film 80*a* is smaller than 5 nm, there is a problem in that it may be difficult to prevent the LED structure from being damaged by the electrolyte in the following operation (D), and when the thickness of the protective film 80*a* exceeds 100 nm, there are problems in that manufacturing costs increase and the LED structures are connected.

Next, the operation (C-2) is an operation of removing the protective film deposited on the upper surface S1 of the first portion (a) between adjacent LED structures to expose the upper surface S1 of the first portion (a) between the LED structures to the outside. (FIG. 10B). Due to the operation C-1 being performed, the protective film material is also deposited on the upper surface S1 of the first portion (a) between adjacent LED structures, and accordingly, since the electrolyte may not come into contact with the first conductive semiconductor layer 10 which is an n-type III-nitride semiconductor, desired pores may not be formed in the first portion (a). Accordingly, an operation of removing the protective film material coated on the upper surface S1 of the first portion (a) and exposing the upper surface S1 to the outside may be performed, and in this case, the protective film material may be removed through a known dry or wet etching method in consideration of the protective film material.

Meanwhile, according to one embodiment of the present disclosure, the protective film 80*a* formed in the operation (C) is a temporary protective film for preventing damage to the LED structures while the operation (D) is performed, and an operation of removing the temporary protective film and then forming a surface protective film surrounding the side surfaces of the LED structure may be further included between the operations (D) and (E). That is, as shown in FIG. 9, a protective film 5' in the operation (C) is provided only as a temporary protective film for preventing damage to the LED structure in the operation (D) (FIGS. 9I to 9K), and is removed before the operation (E) is performed, and then the surface protective film 80 for performing a function of preventing damage to the surface of the LED structure may be formed to cover the side surface of the LED structure (FIG. 9M).

Meanwhile, some embodiments, as shown in FIG. 9, have an inconvenience of forming the protective film twice, but the double formation of the protective film twice may be selected in consideration of a planar shape and a size of the LED structure to be manufactured, and an interval between the LED structures. Further, when the following operation (D) is performed, the protective film may be partially damaged, and since it is difficult to appropriately perform a surface protection function when the damaged protective film is left on the individual LED structure which is finally acquired and used as the surface protective film, in some cases, providing a protective film again after removing the protective film which undergoes the operation (D) may be advantageous.

When describing the manufacturing process shown in FIG. 9, the protective film 5', which is a temporary protective film that protects the side surfaces and upper portions of the plurality of LED structures may be formed by depositing a temporary protective film material 5 on the LED wafer 100*h* formed with the plurality of LED structures (FIG. 9I), and then etching the protective film material 5 deposited on the upper surface S1 of the first portion (a) of the first conductive semiconductor layer 10, which is a doped n-type III-nitride semiconductor layer between adjacent LED structures of the LED wafer 100 on which the temporary protective film material 5 is deposited. After the following operation (D) (FIG. 9K) is performed, the protective film 5' is removed through etching (FIG. 9L), and after depositing a protective film material as a surface protective film for protecting the surface of the LED structure on an LED wafer 100*l*, the protective film material formed on each of the LED structures is removed to form the protective film 80 surrounding the side surfaces of the LED structure (FIG. 9M). In this case, the protective film material deposited on the upper surface S1 of the first portion (a) of the first conductive semiconductor layer 10, which is a doped n-type III-nitride semiconductor layer between adjacent LED structures of an LED wafer 100*m* may be removed along with the protective film material formed on the LED structure. Accordingly, in the operation (E) to be described below, a bubble-forming solvent may come into contact with the upper surface S1 of the first portion (a), and bubbles generated through ultrasonic waves may penetrate into pores P formed in the first portion (a), and thus the LED structure may be separated through the bubbles.

Meanwhile, descriptions of the temporary protective film material and the surface protective film material are the same as that of the material of the above-described protective film, and the implemented film thickness may also be implemented within a thickness range of the above-described protective film.

Next, as the operation (D) of Manufacturing Method 1, an operation of immersing an LED wafer in an electrolyte, electrically connecting the LED wafer to one terminal of a power supply, electrically connecting the other electrode of the power supply to an electrode immersed in the electrolyte, and then applying power to form a plurality of pores in the first portions is performed.

Specifically, when describing with reference to FIG. 10, an LED wafer 100*h*2 on which a protective film 80*a* is formed is electrically connected to any one terminal of a power supply, for example, an anode, and the other terminal of the power supply, for example, a cathode, is electrically connected to an electrode immersed in the electrolyte, and then power is applied. Thus, an LED wafer 100*h*3 in which a plurality of pores P are formed in the first portion (a) of the first conductive semiconductor layer 10 which is a doped n-type III-nitride semiconductor may be manufactured. In this case, the pores P are formed from the upper surface S1 of the first portion (a) of the first conductive semiconductor layer 10, which is a doped n-type III-nitride semiconductor which comes into direct contact with the electrolyte, and may be formed in the thickness direction and a side surface direction of the first portion (a) corresponding to a lower portion of each of the plurality of LED structures.

The electrolyte used in the operation (D) may include one or more oxyacids selected from the group consisting of oxalic acid, phosphoric acid, sulfurous acid, sulfuric acid, carbonic acid, acetic acid, chlorous acid, chloric acid, hydrobromic acid, nitrous acid and nitric acid, and more preferably, for example, oxalic acid may be used, and through this, there is an advantage in that damage to the first conductive semiconductor layer may be minimized. Further, the electrode may be formed of platinum (Pt), carbon (C), nickel (Ni), gold (Au), or the like, and may be, for example, a platinum electrode. In addition, in the operation (D), a voltage of 3V or more may be applied as power for one minute to 24 hours, and accordingly, the pores P may be smoothly formed up to the first portion (a) corresponding to the lower portion of each of the plurality of LED structures, and through this, the LED structures may be easily separated from the wafer through the operation (E). More preferably, the voltage may be 10V or more, and more preferably, a voltage of 30V or less may be applied. Even when an application time of the power is increased when a voltage of less than 3V is applied, since the pores are not smoothly formed in the first portion (a) corresponding to the lower portion of each of the plurality of LED structures, it is difficult to separate the LED structures from the wafer through the following operation (E), or even when the LED structures are separated, separated cross sections of the plurality of LED structures may have different shapes, which may make it difficult for the plurality of LED structures to exhibit uniform characteristics. Further, when a voltage exceeding 30V is applied, the pores may be formed up to a second portion (b), which is a lower end portion of the LED structure which continues from the first portion (a) of the doped n-type III-nitride semiconductor layer, and thus, deterioration of light emitting characteristics may be caused. In addition, in the following operation (E), separation of the LED structures may be performed at a boundary point between the first portion (a) and the second portion (b) of the doped n-type III-nitride semiconductor layer, but since separation may occur at any point in the second portion (b) beyond the boundary point due to the pores formed in the second portion (b), there is a risk that an LED structure having an n-type semiconductor layer with a thickness thinner than a thickness of an initially designed n-type semiconductor layer may be acquired. In addition, similar to effects according to strength of the voltage, when the application time is long, there is a risk that pores are formed up to the second portion (b) departing from a desired portion, and conversely, when the application time is short, the pores may not be smoothly formed, and thus, it may be difficult to separate the LED structures.

Before the following operation (E) and after the operation (D), an operation of manufacturing an LED wafer $100h_4$ in which the protective film formed on the upper surfaces of each of the LED structures among the protective film 80a is removed so that the LED structures may be separated from the wafer and then electrical connection is possible toward the first electrode layer 40 may be further performed. Further, since only the protective film formed on the upper surfaces of the LED structures is removed, the protective film 80 formed on the side surface of the LED structure remains and thus may perform the function of protecting the side surface of the LED structure from the outside.

In addition, before the following operation (E) and after the operation (D), an operation of forming another layer on the first electrode layer 40 may be further performed, and the other layer may be, for example, a Ti/Au composite layer that may be further formed of a first electrode layer material on the first electrode layer 40, which is an ITO layer, or the arrangement inducing layer 70 (See FIG. 9N).

Next, as the operation (E) according to Manufacturing Method 1, the ultrasonic waves are applied to the LED wafer $100h_4$ to separate the plurality of LED structures from the first portion (a) in which the plurality of pores P are formed. In this case, the ultrasonic waves may be directly applied to the LED wafer $100h_4$ formed with the pores or may be indirectly applied by immersing the LED wafer $100h_4$ formed with the pores in a solvent. However, in a method of collapsing the pores P of the first portion (a) using a physical external force caused by the ultrasonic wave itself, since the collapse of the pores is not smooth, and there is a risk that the pores may be formed up to the second portion (b) of the LED structure when the pores are excessively formed to facilitate the collapse, a side effect of reducing the quality of the LED structure may be caused.

Accordingly, according to one embodiment of the present disclosure, the operation (E) may be performed using a sonochemical method, and specifically, the plurality of LED structures may be separated by collapsing the pores through energy generated when bubbles generated and grown through a sonochemical mechanism by immersing the LED wafer $100h_4$ in a bubble-forming solution (or solvent) 76, and then applying the ultrasonic waves to the bubble-forming solution (or solvent) 76, burst in the pores. Specifically, the ultrasonic wave alternately generates a relatively high pressure portion and a relatively low pressure portion in a proceeding direction of a sound wave, and the generated bubbles grow into bubbles having a higher temperature and pressure while repeating contraction and expansion while passing through the high pressure portion and the low pressure portion, and then collapse. The generated bubble becomes, for example a local hotspot which generates a high temperature of 4000 K and a high pressure of 1000 atm when bubbles collapse, and thereby, the pores generated in the LED wafer are collapsed using the energy, and thus the LED structures may be separated from the wafer. Accordingly, the ultrasonic waves perform only functions of producing and growing the bubbles in the bubble-forming solution (or solvent), and then moving and penetrating the generated bubbles into the pores P of the first portion (a), and then the plurality of LED structures may be easily separated from the LED wafer through the pore collapse mechanism in which the pores P collapse by the external force generated when the bubbles, in an unstable state having a high temperature and pressure, which penetrated into the pores P burst, and through this, an LED assembly 100' including a plurality of ultra-thin LED elements 100' may be acquired.

The bubble-forming solution (or solvent) 76 may generate the bubbles when the ultrasonic waves are applied, and as a bubble-forming solution (or solvent), a solution (or solvent) which may be grown to have a high pressure and temperature may be used without limitation, and preferably, a bubble-forming solution (or solvent) having a vapor pressure of 100 mmHg (20° C.) or less, for example, 80 mmHg (20° C.) or less, 60 mmHg (20° C.) or less, 50 mmHg (20° C.) or less, 40 mmHg (20° C.) or less, 30 mmHg or less (20°

C.) or less, 20 mmHg (20° C.) or less, or 10 mmHg (20° C.) or less may be used. When a solvent having a vapor pressure exceeding 100 mmHg (20° C.) is used, separation may not appropriately occur within a short period of time, and thus there is a risk that manufacturing time is prolonged and production costs increase. The bubble-forming solution 76 which satisfies these properties may include, for example, at least one selected from the group consisting of gamma-butyllactone, propylene glycol methyl ether acetate, methyl pyrrolidone, and 2-methoxyethanol. Meanwhile, a solution (or solvent) having a vapor pressure of 100 mmHg at room temperature, for example, at 20° C., may be used as the bubble-forming solution (or solvent), but it should be noted that the operation (E) may be performed by adjusting the conditions for performing the operation (E) so that the vapor pressure of the bubble-forming solution (or solvent) is 100 mmHg or less (for example, a low temperature condition, or the like) under the above-described conditions. In this case, restrictions on types of usable solvents may be wider, and as an example, solvents such as water, acetone, chloroform, and alcohols may be used.

Further, a wavelength of the ultrasonic wave applied in the operation (E) may be applied at a frequency capable of causing a sonochemical effect, specifically, at a frequency capable of growing and collapsing the bubbles so that the bubbles becomes a local hotspot which generates a high pressure and temperature when collapsing, and for example, may be 10 kHz to 2 MHz, and an application time of the applied ultrasonic wave may be one minute to 24 hours, which may facilitate separation of the LED structures from the LED wafer. Even when the wavelength of the applied ultrasonic wave falls within the range, when intensity is low or the application time is short, there is a risk that the LED structures which are not separated from the LED wafer are present or the number of LED structures which are not separated from the LED wafer increases. Further, when the intensity of the applied ultrasonic wave is large or the application time is long, there is a risk that the LED structures may be damaged.

Meanwhile, before the above-described operation (E) is performed, in order to form the second electrode layer 60 on the first conductive semiconductor layer 10, an operation (FIG. 9O) of attaching a support film onto an LED wafer 100n to form another layer, for example, the second electrode layer 60 or an electronic delay layer (not shown), on the first conductive semiconductor layer 10 may be further performed, and then the operation (E) may be performed to separate the plurality of LED structures while the support film 9 is attached (FIG. 9P). Then, an assembly 100 of the ultra-thin LED elements 101 may be acquired when the support film is removed after forming the second electrode layer 60 on the upper portions of the plurality of LED structures with the support film 9 attached thereto through a known method such as deposition or the like (FIG. 9Q).

Next, a method of manufacturing an ultra-thin LED element through Manufacturing Method 2 will be described with reference to FIG. 11.

As described above, a process of forming an LED wafer 100h formed with a plurality of LED structures from an LED wafer is the same as in Manufacturing Method 1. Then, the LED wafer 100h formed with the plurality of LED structures may be formed through (i) an operation of forming an insulating film 8 to cover exposed side surfaces of the plurality of LED structures (FIG. 11B), (ii) an operation of removing a portion of the insulating film formed on a first conductive semiconductor layer 10 so that an upper surface S1 of the first conductive semiconductor layer 10 between adjacent LED structures is exposed (FIG. 11C), (iii) an operation of further etching the first conductive semiconductor layer 10 in the thickness direction through the exposed upper portion S1 to form a portion of the first conductive semiconductor layer of which side surfaces are exposed as much as a predetermined thickness under the first conductive semiconductor layer of an LED pillar on which an insulating film 8' is formed (FIG. 11C), (iv) an operation of etching the portion of the first conductive semiconductor layer, of which the side surfaces are exposed, from both side surfaces toward a center (FIG. 11D), (v) an operation of removing the insulating film 8 (FIG. 11E), (vi) an operation of forming a protective film 80a on the side surfaces of the plurality of LED structures (FIG. 11F), (vii) an operation of exposing a first electrode layer 40 by removing the protective film formed on the plurality of LED structures (FIG. 11G), (viii) an operation of forming an arrangement inducing layer 70 on the first electrode layer 40 (FIG. 11H), and (ix) an operation of manufacturing an ultra-thin LED aggregate 100' including a plurality of ultra-thin LED elements 101' by separating the plurality of LED structures from the LED wafer. Meanwhile, the above-described Manufacturing Method 2 may be appropriately performed using a known method of manufacturing an LED element, and in a detailed description thereof, Korean Patent Application No. 2020-0050884 disclosed by the inventor of the present disclosure is incorporated herein as reference in its entirety, and a detailed description of each operation of Manufacturing Method 2 of the present disclosure is omitted.

In this case, separation of the plurality of LED structures in the operation (ix) may be cutting using a cutting mechanism or detachment using an adhesive film.

Figure 12:
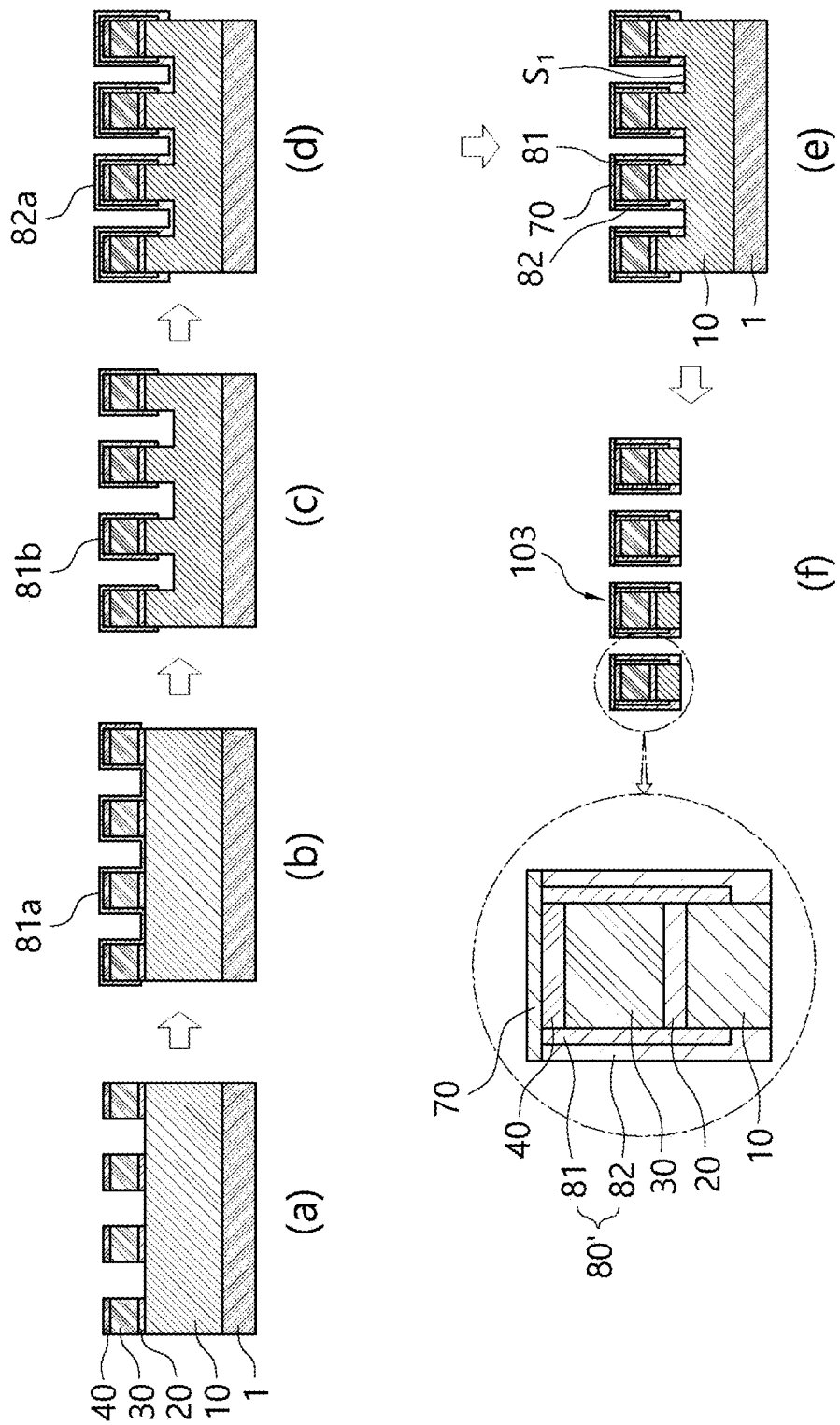
FIG. 12 is a schematic view for one method of manufacturing the ultra-thin LED element used in one embodiment of the present disclosure.

Meanwhile, as described above through FIG. 8, the protective film 80' composed of the hole pushing film 81 and the electron pushing film 82 for improving light emitting efficiency may be formed as a protective film, and a manufacturing method thereof will be described with reference to FIG. 12.

There is a difference from the above-described FIGS. 9 to 11 in that when etching is performed in a vertical direction, primarily etching is performed up to the second conductive semiconductor layer 30, a portion of the photoactive layer 20, or only the photoactive layer 20 without etching up to a portion of the first conductive semiconductor layer 10, which is an n-type semiconductor (FIG. 12A), and then secondary etching is performed up to a partial thickness of the first conductive semiconductor layer 10 (FIG. 12C), and a process of depositing a coating material, and removing the coating material between the plurality of LED structures is performed twice (FIGS. 12B, 12D, and 12E).

Specifically, when the LED wafer is etched in the vertical direction, a process of performing primarily etching up to the second conductive semiconductor layer 30, portions of the second conductive semiconductor layer and the photoactive layer 20, or only the photoactive layer 20 without etching up to a portion of the first conductive semiconductor layer 10, which is an n-type semiconductor and then removing a hole pushing film material 81a formed between the LED structures after depositing the hole pushing film material (FIG. 12B) is performed. Then, secondary etching is performed up to a predetermined thickness of the first conductive semiconductor layer 10 (FIG. 12C), and subsequently, a process of depositing an electron pushing film material 82a on the LED structure on which the hole pushing film 81b is formed (FIG. 12D), and then removing the electron pushing film material formed between the LED structures ($S_1$) (FIG. 12E) may be performed. Then, an ultra-thin LED element 103 may be separated from the LED wafer by performing a process of separating the LED structure in the above-described FIGS. 9 to 11 (FIG. 9K or before, FIG. 10D or before), or a process of separating the LED structures in FIG. 11 (FIG. 11F or before).

The ultra-thin LED elements 101, 102, and 103 acquired through the above-described methods may be implemented with an ink composition. The ink composition may further include a dispersion medium and other additives provided in a known inkjet ink composition, and the present disclosure is not specifically limited in this respect. However, as described above, in the ultra-thin LED elements 101, 102, and 103, since the thickness and the length of the major axis of a cross section perpendicular to the stacking direction satisfy the specific ratio described above, there is an advantage in that the sedimentation is delayed during ink formation and a dispersed state may be maintained for a long time. Further, the concentration of the ultra-thin LED elements 101, 102, and 103 dispersed in the ink composition, and the viscosity of the ink composition may be designed to be suitable for an inkjet printing apparatus for printing the ink composition, and the present disclosure is not specifically limited in this respect. In addition, since the inkjet printing apparatus is an apparatus capable of printing the ink composition containing the ultra-thin LED elements on the first electrode, and may be an apparatus which employs a known method such as a piezoelectric method or an electrostatic method, in the present disclosure, the inkjet printing apparatus and the specific method of printing on the first electrode using the same are not particularly limited.

Next, as the operation (3) according to the present disclosure, an operation of assembling the processed ultra-thin LED elements 101, 102, and 103, for example, printed through the inkjet printing apparatus, to be upright on the first electrodes 311 and 312 in the thickness direction is performed.

After printing the plurality of ultra-thin LED elements 101, 102, and 103 dispersed in the ink composition on the first electrode, all the ultra-thin LED elements may not be located on the disposition regions in the first electrode where the ultra-thin LED elements are disposed. Further, even when the ultra-thin LED elements 101, 102, and 103 are located within the disposition regions, all the ultra-thin LED elements may not be disposed upright on the first electrode in the thickness direction.

Accordingly, as described above, the ultra-thin LED electrode assembly 1000 may further include an arrangement inducing layer 70 for disposing the ultra-thin LED elements 101, 102, and 103 upright in the thickness direction on one side in the thickness direction of the ultra-thin LED elements 101, 102, and 103 and on either one side or both sides of the disposition regions where the ultra-thin LED elements 101, 102, and 103 are disposed on the first electrodes 311 and 312.

Figure 13:
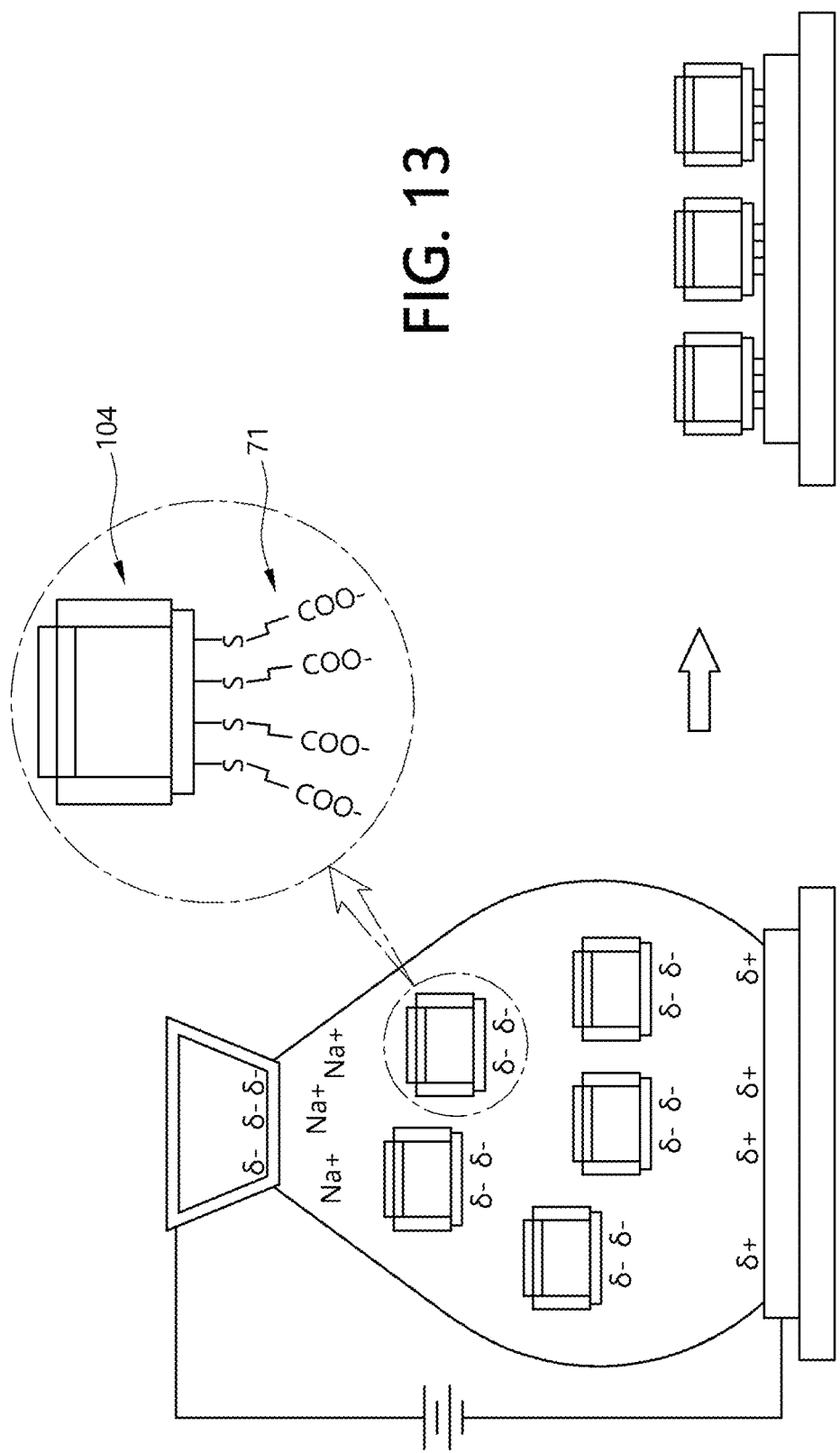
FIGS. 13 to 15 are schematic views of various embodiments of one operation of a method of manufacturing an ultra-thin LED electrode assembly according to one embodiment of the present disclosure.

Specifically, when describing with reference to FIG. 13, when the arrangement inducing layer 70 is a charge layer having a positive charge or negative charge, after printing the ink composition including the ultra-thin LED elements, or together with or before printing, an electric field may be formed in a direction perpendicular to a main surface of the first electrode 311 so that the ultra-thin LED element 104 may be moved to the disposition region through an electrophoresis method and then may be disposed upright in the thickness direction. Further, when the charge layer provided in the ultra-thin LED element is a first charge layer having a positive charge or negative charge so that the ultra-thin LED element may be advantageously moved and disposed upright in the disposition region, a second charge layer having a charge opposite the charge of the first charge layer may be provided in the disposition region in the first electrode. Thicknesses of the first charge layer and the second charge layer may each be, for example, 0.1 to 500 nm, but the present disclosure is not particularly limited thereto since the thickness is not limited when the charge layers have charges.

Further, since strength of the electric field for moving and disposing the ultra-thin LED elements upright in the disposition region through the electrophoresis method may also be appropriately changed in consideration of the number, sizes, and the like of the ultra-thin LED elements in the ink composition, the present disclosure is not specifically limited in this respect.

Figure 14:
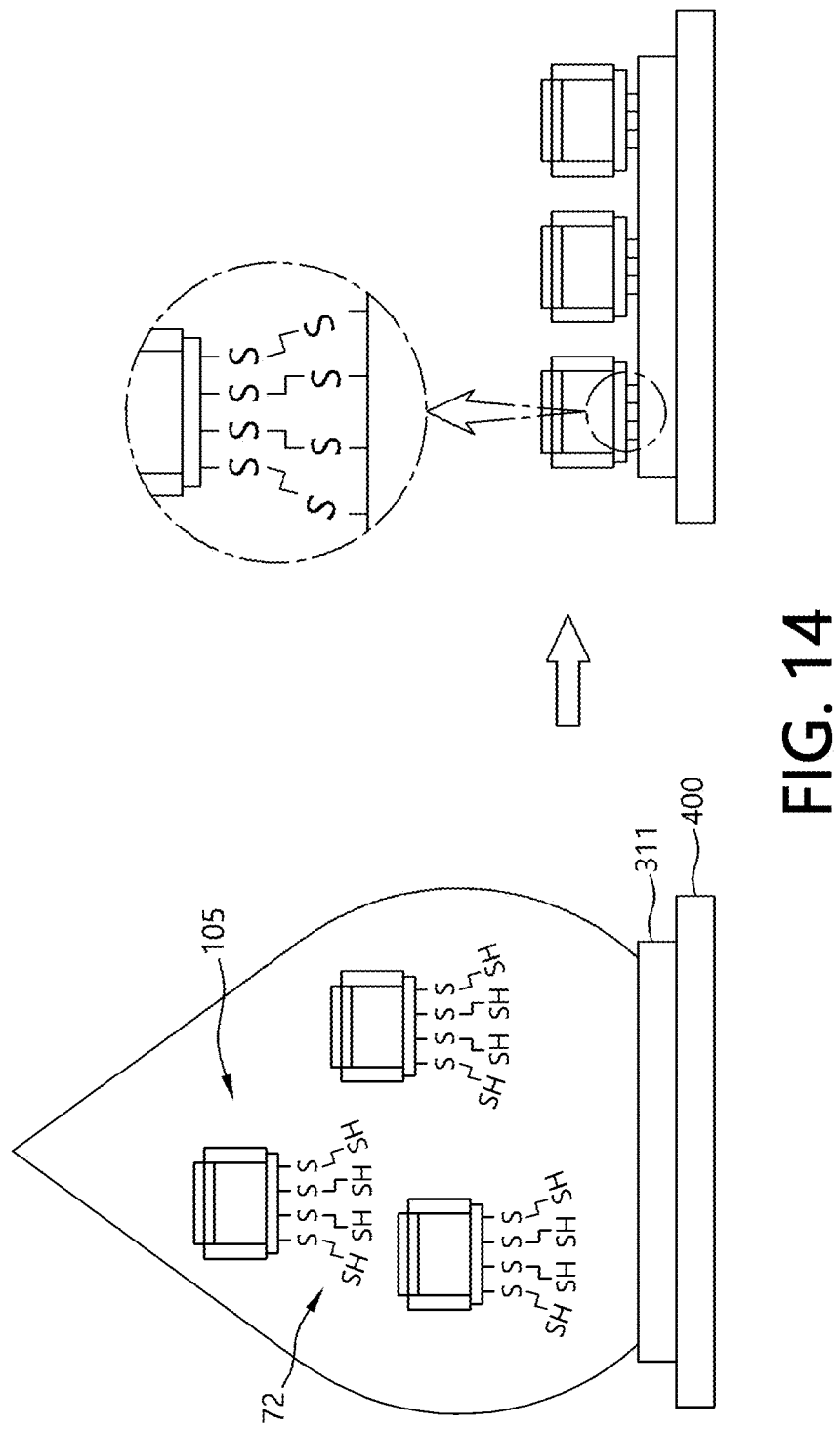

In addition, when describing the case in which the arrangement inducing layer 70 is a bonding layer 72 with reference to FIG. 14, an ultra-thin LED element 105 may be assembled upright in the disposition region through chemical bonding through the bonding layer 72. In this case, the bonding layer 72 may be provided on one side of the ultra-thin LED element 105 in the thickness direction and/or in the disposition region. Also, the bonding layer 72 may be formed so that, for example, a thiol group, an amine group, a carboxyl group, a single strand of DNA, or the like is exposed to the outside, and specifically, may be formed through a compound of aminoethanethiol, 1,2-ethanediolthiol, 1,4-butanedithiol, mercaptopropionic acid (3-mercaptopropionic acid), an $NH_2$-terminated single-strand of DNA, or the like. Further, the chemical bond may be a covalent bond or a non-covalent bond, and for example, a bonding layer in which a thiol group is exposed to the outside may be bonded to the first electrode which is metal through the non-covalent bond. In addition, since a reaction rate is very slow when an amine group is bonded to a carboxyl group to form an amide bond, 1-ethyl-3-(3-dimethylaminopropyl) carbodiimide (EDC) is added to form an active ester intermediate with a carboxyl group, and then the amide bond may be rapidly formed by adding a strong nucleophilic primary amine. In addition, in order to stabilize the ester intermediate using the EDC, sulfo N-hydroxysuccinimide (NHS) may be used so that the amide bond may be stably achieved. In addition, the chemical bond may be a covalent bond or a non-covalent bond, and for example, the bonding layer in which the thiol group is exposed to the outside may be bonded to the first electrode which is metal through the non-covalent bond. In addition, the bonding layer may include a first bonding layer formed on the side of the ultra-thin LED element and a second bonding layer formed on the side of the first electrode, and the ultra-thin LED elements may be assembled upright on the first electrodes through inter-complementary coupling between a first linker in the first bonding layer and a second linker in the second bonding layer.

Figure 15:
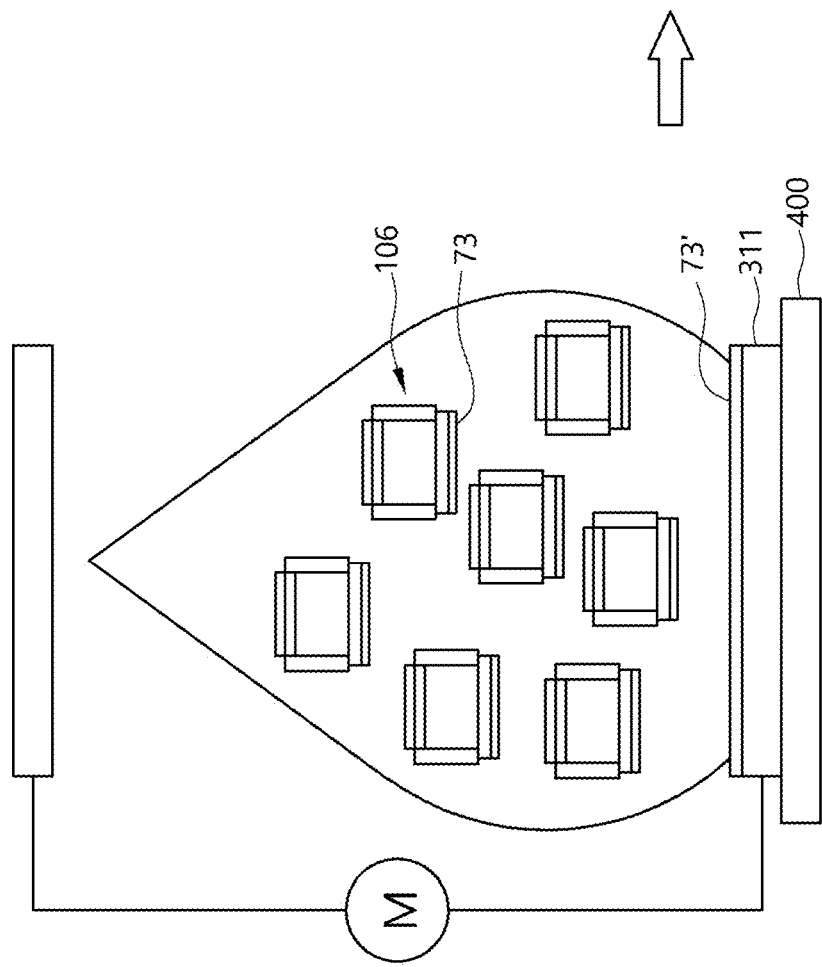

Alternatively, when describing the case in which the arrangement inducing layer 70 is a magnetic layer 73 with reference to FIG. 15, after printing an ink composition including the ultra-thin LED elements so that an ultra-thin LED element 106 is moved to the disposition region through a magnetic force and disposed upright in the thickness direction, or together with or before printing, a magnetic field may be formed in a direction perpendicular to the main surface of the first electrode 311. Further, a magnetic layer may also be formed on the disposition region in the first electrode so that the ultra-thin LED element 106 may be advantageously moved and disposed upright in the disposition region. The magnetic layer may be a paramagnetic material or a ferromagnetic material. Further, the thickness of the magnetic layer 73 may be, for example, 0.1 to 500 nm, the present disclosure is not specifically limited thereto.

Then, an operation in which the ultra-thin LED elements 104, 105, and 106 disposed upright on the first electrodes 311 and 312 are fixed to and come into ohmic contact with the first electrodes 311 and 312 may be further performed. The fixing and ohmic contact may be performed, for example, through a rapid thermal annealing (RTA) process on an interface between the first electrode and the ultra-thin LED element. Alternatively, after a fixing layer having a low melting point is further provided on the disposition regions within the first electrodes 311 and 312, the ultra-thin LED elements 104, 105, and 106 are disposed upright on the disposition regions, and then heat may be applied to melt and solidify the fixed layer, thereby firmly fixing the ultra-thin LED elements 104, 105, and 106 onto the first electrodes 311 and 312. The fixing layer may be formed of, for example, a conventional solder material used as an electric/electronic material.

Meanwhile, in order to improve the electrical connectivity between the ultra-thin LED elements 104, 105, and 106 and the first electrodes 311 and 312, after the operation (3), an operation of forming a conductive metal layer 500 may be further performed. The conductive metal layer 500 may be manufactured by applying a photolithography process using a photosensitive material to pattern a line on which the conductive metal layer is to be deposited and then deposit the conductive metal layer, or by patterning and then etching the deposited metal layer. The process may be performed by appropriately employing a known method, and Korean Patent Application No. 10-2016-0181410 disclosed by the inventor of the present disclosure may be incorporated as a reference.

Further, an operation of forming an insulating layer 600 with a predetermined thickness on a lower electrode line 310 for electrical insulation from an upper electrode line 320 to be formed in the following operation (4) later may be further performed. The insulating layer 600 may be formed through deposition of a known insulating material. For example, an insulating material such as $SiO_2$ or $SiN_x$ is deposited through a plasma enhanced chemical vapor deposition (PECVD) method, or an insulating material such as AlN or GaN is deposited through a metal organic chemical vapor deposition (MOCVD) method. Alternatively, an insulating material such as $Al_2O$, $HfO_2$, or $ZrO_2$ may be deposited through an atomic layer deposition (ALD) method. Meanwhile, the insulating layer 600 may be formed so as not to cover the upper surfaces of the ultra-thin LED elements 104, 105, and 106 which are assembled upright, and to this end, dry etching may be performed until the upper surfaces of the ultra-thin LED elements 104, 105, and 106 are exposed after forming the insulating layer through deposition to a thickness which does not cover the upper surfaces of the ultra-thin LED elements 104, 105, and 106, or depositing the insulating layer to a thickness which covers the upper surfaces of the ultra-thin LED elements 104, 105, and 106.

Next, as the operation (4) according to the present disclosure, an operation of forming the upper electrode line 320 including the second electrodes 321 and 322 to be electrically connected to the sides opposite one sides of the ultra-thin LED elements 104, 105, and 106 electrically connected to the first electrodes 311 and 312 is performed. The upper electrode line 320 may be implemented by depositing an electrode material after patterning an electrode line using known photolithography, or by depositing an electrode material and then performing dry etching and/or wet etching. In this case, the electrode material may be a conventional electrode material used as an electrode of an electric/electronic material, and the present disclosure is not specifically limited thereto.

The ultra-thin LED electrode assembly 1000 using the ultra-thin LED elements described above may be used without limitation in various electrical and electronic components or electrical and electronic devices using LEDs, for example, lighting, a display, a medical device, a beauty device, and the like.

The present disclosure will be more specifically described through the following embodiments, but the following embodiments are not intended to limit the scope of the present disclosure, which should be interpreted to aid understanding of the present disclosure.

Preparation Example 1

Figure 16:
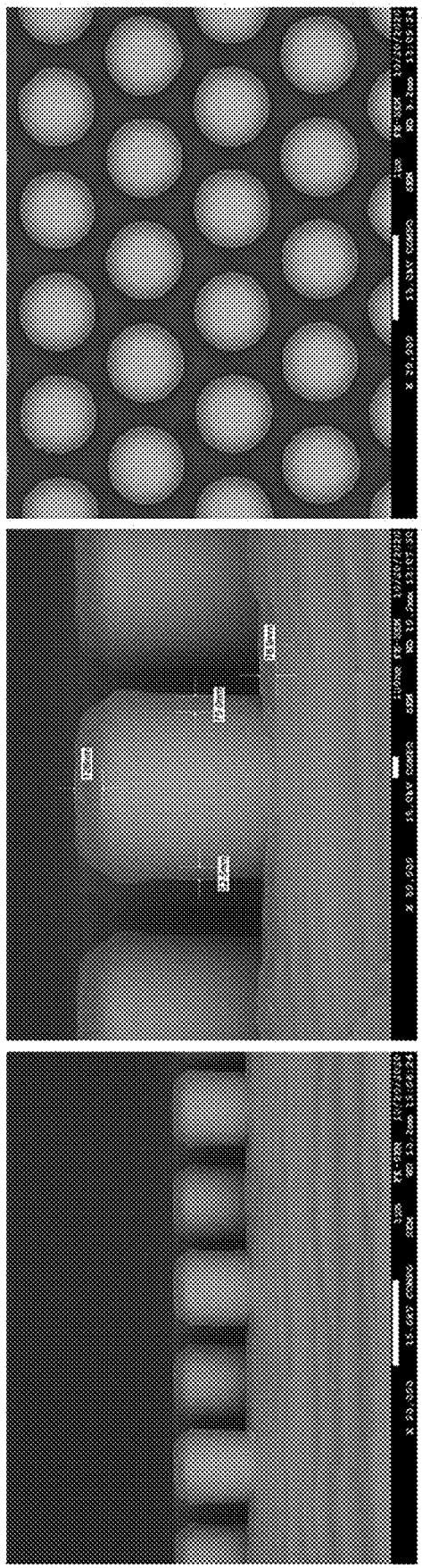
FIGS. 16 and 17 are scanning electron microscope (SEM) photographs in a specific operation in a method of manufacturing the ultra-thin LED element used in one embodiment of the present disclosure.

A common LED wafer (Epistar) in which an undoped n-type III-nitride semiconductor layer, an n-type III-nitride semiconductor layer doped with Si (a thickness of 4 μm), a photoactive layer (a thickness of 0.45 μm), and a p-type III-nitride semiconductor layer (a thickness of 0.05 μm) are sequentially stacked on a substrate was provided. ITO (a thickness of 0.15 μm) as a first electrode layer, $SiO_2$ (a thickness of 1.2 μm) as a first mask layer, and Al (a thickness of 0.2 μm) as a second mask layer were sequentially deposited on the prepared LED wafer, and a spin on glass (SOG) resin layer onto which a pattern is transferred was transferred onto the second mask layer using nanoimprint equipment. Then, the SOG resin layer was cured using RIE, and the residual resin portion of the resin layer was etched through RIE to form a resin pattern layer. Then, the second mask layer was etched according to the pattern, using ICP and the first mask layer was etched using RIE. Next, after the first electrode layer, the p-type III-nitride semiconductor layer, and the photoactive layer were etched using ICP, the doped n-type III-nitride semiconductor layer was etched to a thickness of 0.78 μm, and then, an LED wafer, on which a plurality of LED structures (with a diameter of 850 nm and a height of 850 nm) are formed through KOH wet etching so that a side surface of the etched doped n-type III-nitride semiconductor layer is perpendicular to a layer surface, was manufactured. Then, a $SiN_x$ protective film material was deposited on the LED wafer on which the plurality of LED structures were formed (See SEM photo in FIG. 16, deposition thicknesses of 52.5 nm and 72.5 nm based on the side surfaces of the LED structures), and then the protective film material formed between the plurality of LED structures was removed through a reactive ion etcher to expose an upper surface S1 of a first portion (a) of the doped n-type III-nitride semiconductor layer.

Figure 17:
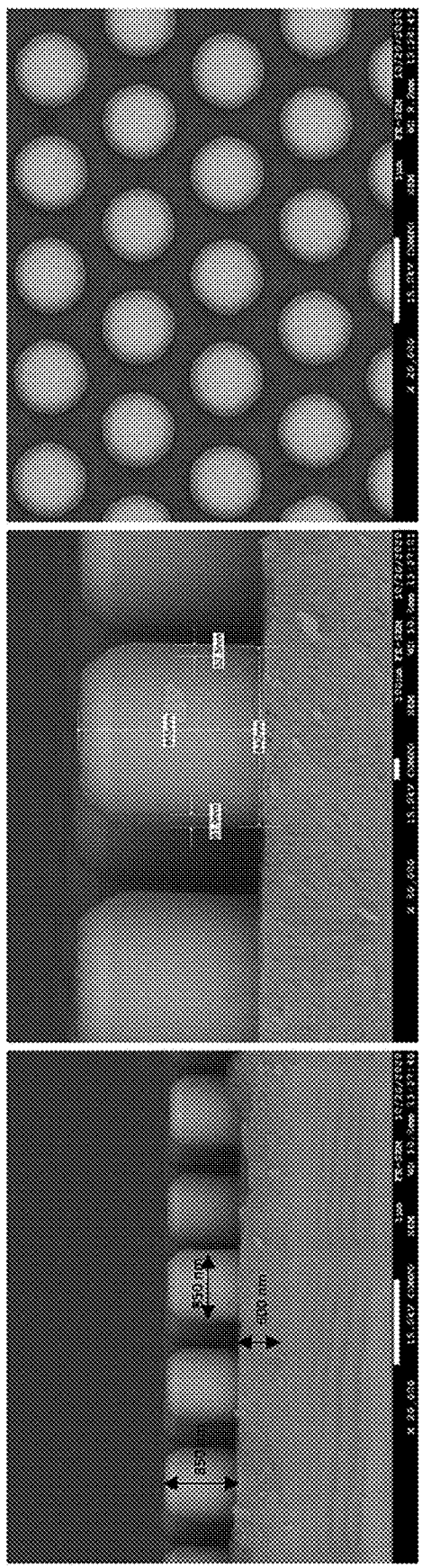
Figure 18:
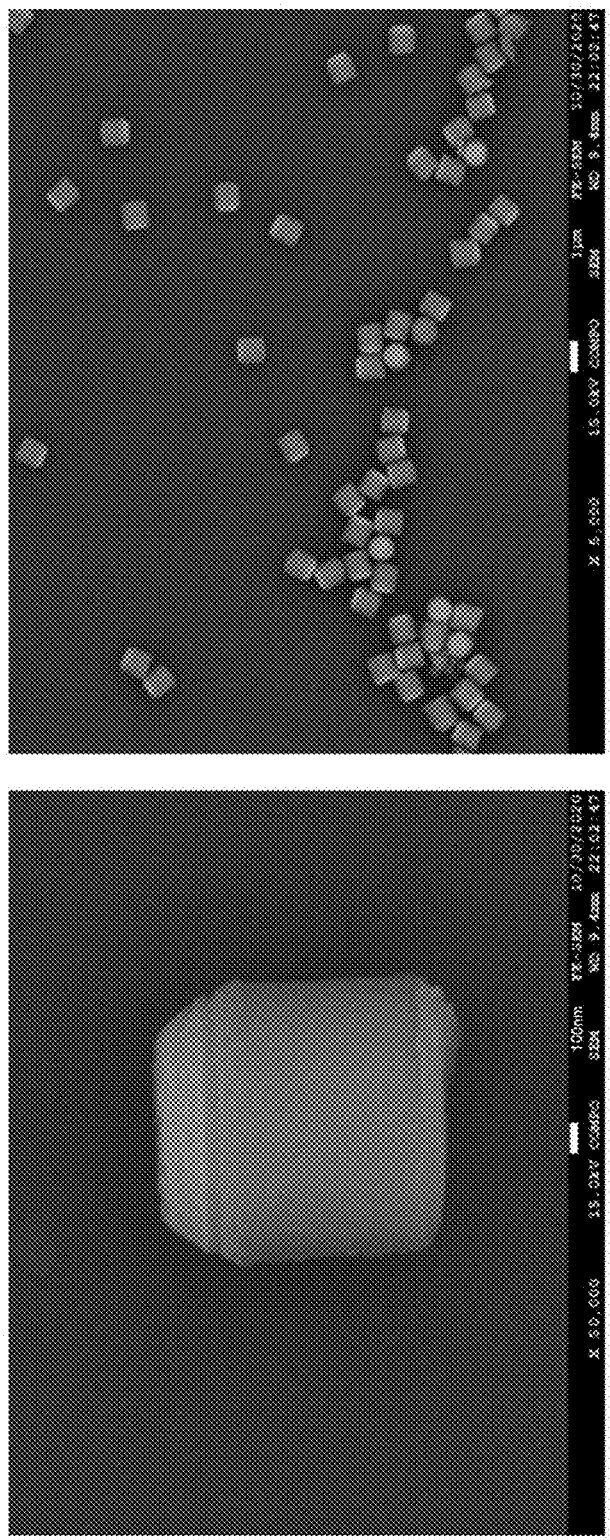
FIG. 18 is an SEM photograph of the ultra-thin LED element used in one embodiment of the present disclosure.
Figure 19:
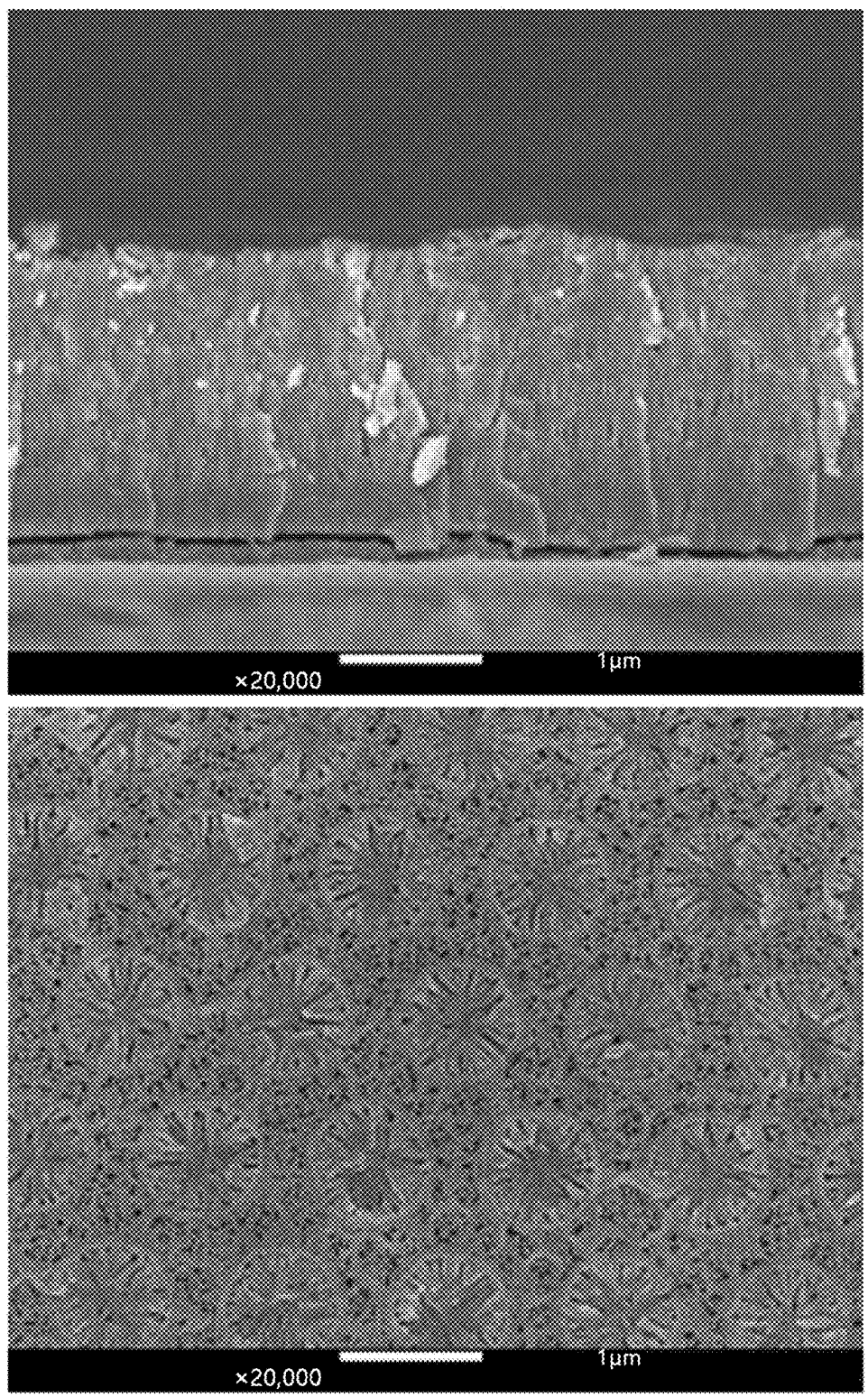
FIG. 19 is an SEM photograph of an LED wafer remaining after manufacturing the ultra-thin LED element in a manufacturing process of the ultra-thin LED element used in one embodiment of the present disclosure.

Then, the LED wafer on which a temporary protective film was formed was immersed in an electrolyte which is a 0.3 M oxalic acid aqueous solution and then connected to an anode terminal of a power supply, and a cathode terminal was connected to a platinum electrode immersed in the electrolyte, and then a voltage of 10V was applied for 5 minutes to form a plurality of pores from the surface of the first portion (a) of the doped n-type III-nitride semiconductor layer to a depth of 600 nm as shown in the SEM photograph in FIG. 17. Then, after removing the temporary protective film through RIE, a surface protective film formed of $Al_2O_3$ was redeposited on the LED wafer to a thickness of 50 nm with respect to the side surface of the LED structure, and the surface protection film formed on the plurality of LED structures and the surface protection film formed on the upper surface S1 of the first portion (a) of the doped n-type III-nitride semiconductor layer were removed through ICP to expose the upper surface S1 of the first portion (a) of the doped n-type III-nitride semiconductor layer and the upper surfaces of the LED structures. Then, the LED wafer was immersed in a bubble-forming solution, which is gamma-butyllactone, and then irradiated with an ultrasonic wave at a frequency of 40 kHz for 10 minutes to collapse the pores formed in the doped n-type III-nitride semiconductor layer using the generated bubbles, thereby manufacturing an ultra-thin LED element aggregate in which the plurality of LED structures are separated from the wafer, and the ultra-thin LED elements are included as shown in the SEM photograph in FIG. 18. Further, it can be seen that there are no non-separated LED structures on the wafer as shown in FIG. 19.

Comparative Preparation Example 1

A rod-type LED element aggregate having the same stacked structure as in Example 1 and having a diameter of 650 nm and a height of 4.2 μm was manufactured from an LED wafer through a common method.

Experimental Example 1

Figure 20:
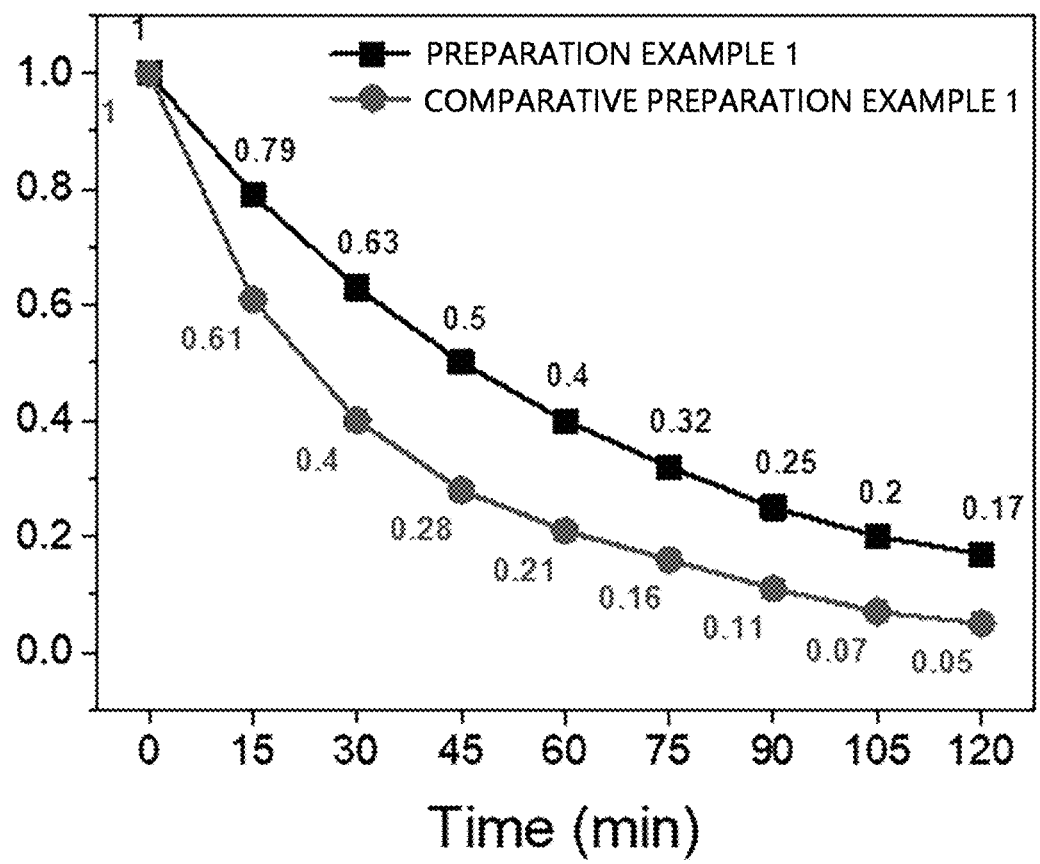
FIG. 20 is a graph of absorbance over time in which a spectral area of a visible light region of 380 to 780 nm is normalized using absorbance for each wavelength measured over time in an ink composition in which the ultra-thin LED element and the rod-type LED element are dispersed in acetone, respectively.

Each of the LED element assemblies manufactured in Preparation Example 1 and Comparative Preparation Example 1 was put into acetone, and dispersed by being irradiated with ultrasonic waves under a 100 W condition, and then a dispersion state of the LED element was confirmed by measuring absorbance at 15 minute intervals for 2 hours, and a spectral area of the visible light region of 380~780 nm was normalized using the measured results to be shown as an absorbance graph over time as shown in FIG. 20.

As can be seen from FIG. 20, it can be seen that an ultra-thin LED element according to Example 1 has excellent dispersion retention in the acetone solvent for a long time compared to the rod-type LED element according to Comparative Example 1.

Example 1

An ultra-thin LED element aggregate manufactured in the same manner as the ultra-thin LED element manufactured in Preparation Example 1, and further formed with a Ti/Au layer (a thickness of 10 nm/100 nm) as an electrode layer on the first electrode layer and then formed with a bonding layer with exposed thiol groups by treating 1,2-ethanedithiol on the Ti/Au layer before separating from the LED wafer through ultrasonic waves was prepared Then, the ultra-thin LED elements were assembled upright on the first electrodes for a predetermined time by immersing a lower electrode line including the first electrodes in an ink composition containing the ultra-thin LED element aggregate. At this time, an ultra-thin LED element having a diameter of 750 nm and a height of 1.1 μm was used as the ultra-thin LED element. Then, after forming $SiO_2$ (1.4 μm to 1.6 μm) as an insulating layer for serving as an insulator, an ultra-thin LED electrode aggregate having a lateral length and a longitudinal length of 0.3 mm, respectively, was manufactured by etching the insulating layer formed as much as the corresponding thickness to expose 300 nm to 400 nm of n-GaN of the ultra-thin LED element, and depositing 150 nm of AZO or ITO used as a transparent electrode on the exposed ultra-thin LED elements to form an upper electrode line including the second electrodes on the ultra-thin LED elements.

Experimental Example 2

Power was applied to the upper electrode line and the lower electrode line of the ultra-thin LED electrode aggregate manufactured in Example 1, and a photograph of the ultra-thin LED electrode aggregate which emits light was taken and shown in FIG. 21.

Since an ultra-thin light-emitting diode (LED) electrode assembly according to the present disclosure can be realized through inkjet printing by ink formation of an ultra-thin LED element, a large-area electrode assembly can be more easily implemented. Further, it is advantageous in achieving high luminance and light efficiency by increasing a light emitting area of the element compared to an electrode assembly using a conventional rod-type LED element. In addition, since an area of a photoactive layer exposed on a surface can be greatly reduced to prevent or minimize a decrease in efficiency due to surface defects while increasing the light emitting area of the element, an electrode assembly with excellent quality can be implemented. Further, the used LED element achieves improved luminous efficiency by optimizing an electron-hole recombination rate according to non-uniformity of electron and hole velocities, and thus can be widely applied to various types of lighting, light sources, displays, and the like.

Although embodiments of the present disclosure have been described above, the spirit of the present disclosure is not limited to the embodiments shown in the description, and although those skilled in the art may provide other embodiments through the addition, change, or removal of the components within the scope of the same spirit of the present disclosure, such embodiments are also included in the scope of the spirit of the present disclosure.

What is claimed is:

1. A method of manufacturing an ultra-thin LED electrode assembly, the method comprising:
    (1) an operation of preparing a lower electrode line including a first electrode;
    (2) an operation of treating an ink composition including a plurality of ultra-thin LED elements on the first electrode, wherein each ultra-thin LED element comprises each including a first conductive semiconductor layer, a photoactive layer, and a second conductive semiconductor layer which are stacked, and has a ratio of 1:0.5 to 1.5 between a thickness which is a stacking direction and a length of a long axis in a cross-section perpendicular to the stacking direction, and has a thickness of 2 μm or less and a maximum surface area of 4.0 μm$^2$ or less which is a maximum value among areas of a vertical projection surface;
    (3) an operation of assembling the ultra-thin LED elements to be upright in a thickness direction on the first electrode; and
    (4) an operation of forming an upper electrode line including a second electrode to be electrically connected to a side opposite one side of each of the ultra-thin LED elements assembled on the first electrode.

2. The method of claim 1, wherein:
    a magnetic layer is further provided on one side of the ultra-thin LED element in the thickness direction and on a disposition region in the first electrode where the ultra-thin LED element is disposed; and a magnetic field is formed in a direction perpendicular to a main surface of the first electrode so that the ultra-thin LED element is moved to the disposition region and disposed upright in the thickness direction in the operation (3).

3. The method of claim 1, wherein:
a first charge layer having a positive charge or negative charge is further provided on one side of the ultra-thin LED element in the thickness direction;
a second charge layer having a charge opposite that of the first charge layer is further provided on a disposition region in the first electrode where the ultra-thin LED element is disposed; and
an electric field is formed in a direction perpendicular to a main surface of the first electrode so that the ultra-thin LED element is moved to the disposition region and disposed upright in the thickness direction in the operation (3).

4. The method of claim 1, wherein:
the ultra-thin LED elements are assembled to be upright on the disposition region through a chemical bond through a bonding layer between one side of the ultra-thin LED element in the thickness direction and the disposition region in the first electrode where the ultra-thin LED element is disposed in the operation (3); and
the bonding layer is provided on one side of the ultra-thin LED element in the thickness direction and on either one or both sides of the disposition region.

* * * * *